US011329452B2

(12) United States Patent
Nagarajan et al.

(10) Patent No.: US 11,329,452 B2
(45) Date of Patent: May 10, 2022

(54) SILICON PHOTONICS BASED TUNABLE LASER

(71) Applicant: Marvell Asia Pte Ltd., Singapore (SG)

(72) Inventors: Radhakrishnan L. Nagarajan, Santa Clara, CA (US); Masaki Kato, Palo Alto, CA (US); Nourhan Eid, Santa Clara, CA (US); Kenneth Ling Wong, Santa Clara, CA (US)

(73) Assignee: Marvell Asia Pte Ltd., Singapore (SG)

( * ) Notice: Subject to any disclaimer, the term of this patent is extended or adjusted under 35 U.S.C. 154(b) by 0 days.

(21) Appl. No.: 16/818,801

(22) Filed: Mar. 13, 2020

(65) Prior Publication Data
US 2020/0212651 A1 Jul. 2, 2020

Related U.S. Application Data

(63) Continuation of application No. 16/179,651, filed on Nov. 2, 2018, now Pat. No. 10,637,208.

(51) Int. Cl.
H01S 3/10 (2006.01)
H01S 5/0687 (2006.01)
(Continued)

(52) U.S. Cl.
CPC ............ H01S 5/0687 (2013.01); H01S 5/021 (2013.01); H01S 5/026 (2013.01); H01S 5/028 (2013.01);
(Continued)

(58) Field of Classification Search
CPC ............ H01S 5/0234; H01S 5/14–142; H01S 5/1025; H01S 5/1021; H01S 5/1042;
(Continued)

(56) References Cited

U.S. PATENT DOCUMENTS 10,637,208 B1 4/2020 Nagarajan et al.
10,754,091 B1 * 8/2020 Nagarajan ........... H01S 5/02375
(Continued)

OTHER PUBLICATIONS

Hatori et al., "A Novel Spot Size Convertor for Hybrid Integrated Light Sources on Photonics-Electronics Convergence System," IEEE 9th International Conference, 2012, pp. 171-173.
(Continued)

Primary Examiner — Tod T Van Roy
Assistant Examiner — Delma R Fordé

(57) ABSTRACT

A tunable laser device based on silicon photonics includes a substrate configured with a patterned region comprising one or more vertical stoppers, an edge stopper facing a first direction, a first alignment feature structure formed in the patterned region along the first direction, and a bond pad disposed between the vertical stoppers. Additionally, the tunable laser includes an integrated coupler built in the substrate located at the edge stopper and a laser diode chip including a gain region covered by a P-type electrode and a second alignment feature structure formed beyond the P-type electrode. The laser diode chip is flipped to rest against the one or more vertical stoppers with the P-type electrode attached to the bond pad and the gain region coupled to the integrated coupler. Moreover, the tunable laser includes a tuning filter fabricated in the substrate and coupled via a wire waveguide to the integrated coupler.

21 Claims, 16 Drawing Sheets

(51) Int. Cl.

| | |
|---|---|
| *H01S 5/343* | (2006.01) |
| *H01S 5/40* | (2006.01) |
| *H01S 5/10* | (2021.01) |
| *H01S 5/06* | (2006.01) |
| *H01S 5/028* | (2006.01) |
| *H01S 5/026* | (2006.01) |
| *H01S 5/02* | (2006.01) |
| *H01S 5/14* | (2006.01) |
| *H01S 5/0234* | (2021.01) |
| *H01S 5/02375* | (2021.01) |
| *H01S 5/02326* | (2021.01) |
| *H01S 5/065* | (2006.01) |
| *H01S 5/0625* | (2006.01) |

(52) U.S. Cl.
CPC .......... *H01S 5/0234* (2021.01); *H01S 5/0261* (2013.01); *H01S 5/0287* (2013.01); *H01S 5/02326* (2021.01); *H01S 5/02375* (2021.01); *H01S 5/0612* (2013.01); *H01S 5/0656* (2013.01); *H01S 5/06256* (2013.01); *H01S 5/1007* (2013.01); *H01S 5/1021* (2013.01); *H01S 5/1025* (2013.01); *H01S 5/1042* (2013.01); *H01S 5/142* (2013.01); *H01S 5/34306* (2013.01); *H01S 5/40* (2013.01); *H01S 5/4006* (2013.01)

(58) Field of Classification Search
CPC ....... H01S 5/021; H01S 5/0625–06256; H01S 5/0612; H01S 5/0624
See application file for complete search history.

(56) References Cited

U.S. PATENT DOCUMENTS

| | | |
|---|---|---|
| 2014/0079082 A1 | 3/2014 | Feng et al. |
| 2016/0156149 A1 | 6/2016 | Takabayashi |
| 2017/0207600 A1 | 7/2017 | Klamkin |
| 2018/0233880 A1 | 8/2018 | Nadeau et al. |
| 2018/0269654 A1 | 9/2018 | Zhang |
| 2020/0067276 A1* | 2/2020 | Ma ........................ H01S 3/1307 |
| 2020/0280173 A1* | 9/2020 | Gao ........................ H01S 5/141 |
| 2020/0301070 A1* | 9/2020 | Nagarajan ............. H01S 5/1032 |
| 2020/0301071 A1* | 9/2020 | Nagarajan ........... H01S 5/02375 |
| 2020/0341193 A1* | 10/2020 | Nagarajan ............. G02B 6/428 |
| 2021/0273408 A1* | 9/2021 | He ........................ H01S 5/0687 |

OTHER PUBLICATIONS

Moscoso-Martir et al., "Hybrid Silicon Photonics Flip-Chip Laser Integration with Vertical Self-Alignment," Conference on Lasers and Electro-Optics Pacific Rim, 2017.

Nemoto et al., "Narrow spectral linewidth wavelength tunable laser with Si photonic-wire waveguide ring resonators," IEEE 9th International Conference, 2012, pp. 216-218.

Quack et al., "MEMS-enabled Silicon Photonic Integrated Devices and Circuits," IEEE Journal of Quantum Electronics, 2020, pp. 1-10.

Song et al., "Tunable 3D Hybrid Integrated Silicon Photonic External Cavity Laser," CLEO, 2017.

Song et al., "Tunable 3D Integrated Hybrid Silicon Laser," Asia Communications and Photonics Conference (AGP), 2017.

Search and Examination Report dated Feb. 24, 2020 for UK Application No. GB1913277.8.

* cited by examiner

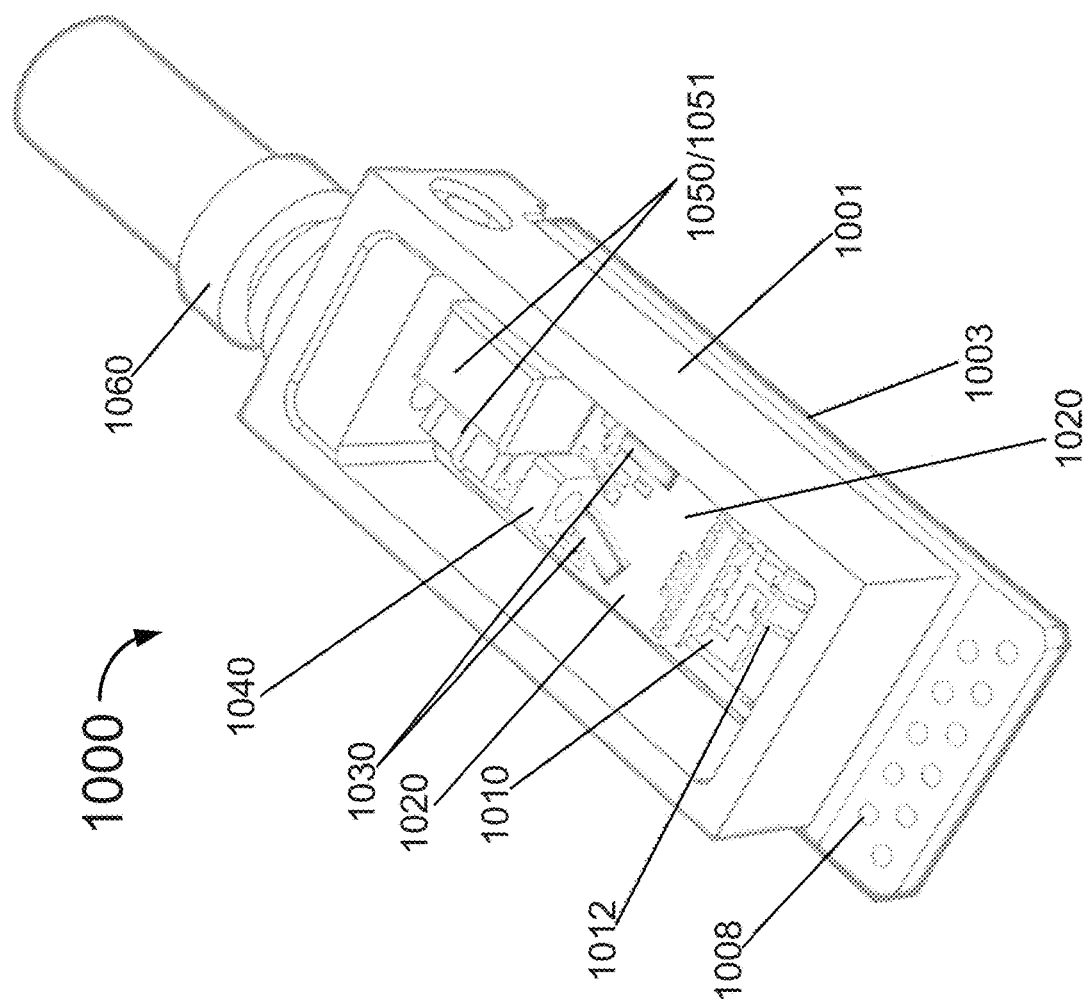

SILICON PHOTONICS BASED TUNABLE LASER

CROSS-REFERENCE TO RELATED APPLICATIONS

This application is a continuation application of and claims priority to U.S. patent application Ser. No. 16/179,651, filed on Nov. 2, 2018, commonly assigned and hereby incorporated by references for all purposes.

BACKGROUND OF THE INVENTION

The present invention relates to optical telecommunication techniques. More particularly, the present invention provides a silicon photonics based tunable laser, a method for performing wide-band wavelength tuning, a system having the same.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

40-Gbit/s and then 100-Gbit/s data rates wide-band DWDM (Dense Wavelength Division Multiplexed) optical transmission over existing single-mode fiber is a target for the next generation of fiber-optic communication networks. Chip-scale widely-tunable lasers have been of interest for many applications such as wide-band DWDM communication and wavelength-steered light detection and ranging (LIDAR) sensing. More recently, optical components are being integrated on silicon (Si) substrates for fabricating large-scale photonic integrated circuits that co-exist with micro-electronic chips. a whole range of photonic components, including filters, (de)multiplexers, splitters, modulators, and photodetectors, have been demonstrated, mostly in the silicon-on-insulator (SOI) platform. The SOI platform is especially suited for standard DWDM communication bands at 1300 nm and 1550 nm, as silicon (n=3.48) and its oxide $SiO_2$ (n=1.44) are both transparent, and form high-index contrast, high-confinement waveguides ideally suited for medium to high-integration photonic integrated circuits (PICs).

However, electrically pumped efficient sources on silicon remain a challenge due to the indirect bandgap of silicon. Therefore, improved techniques and methods in which Si PIC is coupled to III/V PIC that provides gain and lasing are desired.

BRIEF SUMMARY OF THE INVENTION

The present invention relates to optical telecommunication techniques. More particularly, the present invention provides a silicon photonics based tunable laser. Merely by example, the present invention discloses a widely-tunable laser including a silicon photonics thermal tuning section integrated with an InP-based gain region via flip-chip with P-side down integration for greater than 40 nm wide-band DWDM optical communications, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

In an embodiment, the present invention provides a tunable laser device based on silicon photonics. The tunable laser device includes a substrate configured with a patterned region comprising one or more vertical stoppers, an edge stopper facing a first direction, a first alignment feature structure formed in the patterned region along the first direction, and a bond pad disposed between the vertical stoppers. The tunable laser device further includes an integrated coupler built in the substrate located at the edge stopper. Additionally, the tunable laser device includes a laser diode chip including a gain region covered by a P-type electrode and a second alignment feature structure formed beyond the P-type electrode, the laser diode chip being flipped to rest against the one or more vertical stoppers with the P-type electrode attached to the bond pad and the gain region coupled to the integrated coupler. Furthermore, the tunable laser device includes a tuning filter fabricated in the substrate and coupled via a wire waveguide to the integrated coupler.

In an alternative embodiment, the present invention provides a tunable laser device based on silicon photonics. The tunable laser device includes a substrate configured with a first patterned region and a second patterned region. Each of the first patterned region and the second patterned region includes two vertical stoppers, an edge stopper facing a first direction, and a bond pad between the two vertical stoppers. The tunable laser device further includes a first integrated coupler built in the substrate next to the edge stopper associated with the first patterned region and a second integrated coupler built in the substrate next to the edge stopper associated with the second patterned region. Additionally, the tunable laser device includes a first laser diode chip flip bonded in the first patterned region with a first gain region aligned with the first integrated coupler and a second laser diode flip bonded in the second patterned region with a second gain region aligned with the second integrated coupler. Furthermore, the tunable laser device includes a silicon photonics tuning filter fabricated in the substrate and coupled via a first waveguide to the first integrated coupler to deliver a light to the first laser diode chip and via a second waveguide to the second integrated coupler to receive a reflected light from the second laser diode chip. Moreover, the tunable laser device includes a wavelength locker fabricated in the substrate and coupled to the silicon photonics tuning filter to monitor the reflected light for locking a wavelength of laser light outputted through the first laser diode chip.

In yet another alternative embodiment, the present invention provides a method of tuning wavelengths of a silicon photonics based tunable laser device. The tunable laser device includes a first active region for generating light, a tunable filter having a first ring resonator, a second ring resonator, and a phase shifter, a second active region acting as a ring reflector for reflecting the light to the tunable filter, and a wavelength locker having an input port coupled to the tunable filter to monitor the light. The method includes generating light from a combination of the first active region and the second active region. The method further includes inputting the light with gain from the second active region to the tunable filter. Additionally, the method includes providing additional gain and reflecting the light from the second active region to the tunable filter. The method further includes setting respectively a first heater associated with the first ring resonator, a second heater associated with the second ring resonator, and a third heater associated with the phase shifter to set an optimal temperature point corresponding to an ITU channel. Furthermore, the method includes monitoring photocurrents at a monitor port split from the input port, a first interference output port, and a second interference output port of the wavelength locker based on the light reflected from the second active region and filtered by the tunable filter. The method also includes tuning the first heater and the second heater to coarsely tune transmission spectrum through each of the first ring resonator and the second ring resonator until the photocurrents at the first interference output port and the second interference output port are equal. Moreover, the method includes tuning the third heater to finely tune reflection spectrum to determine a wavelength that meets a round trip cavity lasing condition with a maximum gain by maximizing the photocurrent of the monitor port of the wavelength locker, and locking the wavelength to the ITU channel.

In still another alternative embodiment, the present invention provides a package structure for a silicon photonics based tunable laser. The package structure includes a heatsink baseplate and a ceramic plate including a solid ring body surrounding a central opening and partially overlying a peripheral region on one side of the heatsink baseplate. The solid ring body includes an end section containing a near part with a plurality of bond pads next to the central opening and a far part with a plurality of conductor pads distal to the central opening. The package structure further includes a thermal electric cooler sub-assembly attached on the heatsink baseplate within the central opening of the ceramic plate. Additionally, the package structure includes a silicon photonics substrate mounted via a submount structure on the thermal electric cooler sub-assembly and at least one laser diode chip flipped mounting on the silicon photonics substrate. The package structure further includes a lens sub-assembly disposed on the submount structure next to the silicon photonics substrate to align with the laser diode chip. Furthermore, the package structure includes an optical isolator sub-assembly coupled with the lens sub-assembly. Moreover, the package structure includes a metal frame covered by a lid and attached with the solid ring body of the ceramic plate to form a sealed package with the heatsink baseplate at bottom, a window region at a front end for mounting a fiber receptacle aligned with the optical isolator sub-assembly, and a backend for allowing the far part of the end section of the ceramic plate to be left outside the sealed package.

The present invention achieves these benefits and others in the context of known waveguide laser modulation technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 15 is a perspective top view diagram of the package (with a lid being removed) of the silicon photonics tunable laser device according to the embodiment of the present invention.

DETAILED DESCRIPTION OF THE INVENTION

Figure 1:
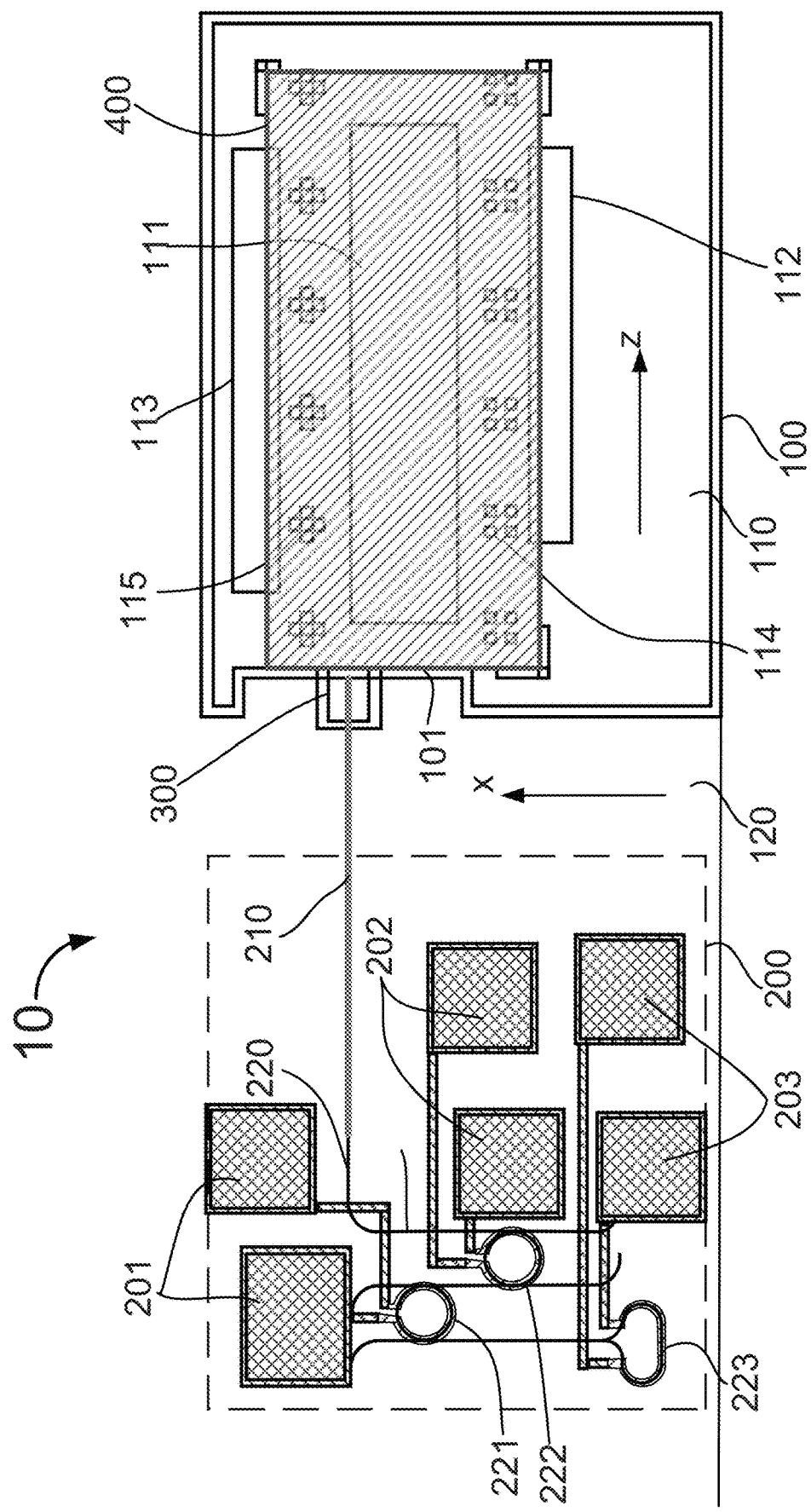
FIG. 1 is a simplified diagram of a silicon photonics tunable laser device according to an embodiment of the present invention.

The present invention relates to optical telecommunication techniques. More particularly, the present invention provides a silicon photonics based tunable laser. Merely by example, the present invention discloses a widely-tunable laser including a silicon photonics thermal tuning section integrated with an InP-based gain region via flip-chip with P-side down integration for greater than 40 nm wide-band DWDM optical communications, though other applications are possible. Optionally, layout of two gain regions is employed to achieve higher output power. Optionally, integrated photodiodes are used together with a hybrid Si and Silicon Nitride wire-based wavelength locker to lock wavelength to respective channels of a wide band such as ITU (International Telecommunications Union) channels in C-band. A method of performing wavelength tuning based on a tunable filter configured as a Vernier ring reflector is also disclosed. Furthermore, an embodiment of a package structure of the silicon photonics tunable laser device is also disclosed.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counterclockwise have been used for convenience purposes only and are not intended to imply any particular fixed direction. Instead, they are used to reflect relative locations and/or directions between various portions of an object.

FIG. 1 is a simplified diagram of a silicon photonics tunable laser device according to an embodiment of the present invention. This diagram is merely an example, which should not unduly limit the scope of the claims. One of ordinary skill in the art would recognize many variations, alternatives, and modifications. As shown, a silicon photonics tunable laser device 10 includes a laser diode flip-chip 400, a tunable filter 200, and an integrated coupler 300, all of them being integrated into a single silicon photonics substrate 100. The silicon photonics substrate 100 includes a patterned region 110 pre-fabricated with one or more vertical stoppers 112 and 113, a plurality of alignment features 114, 115 substantially distributed along a first direction z, and a bond pad 111 laid substantially between the one or more vertical stoppers 112 and 113. The patterned region 110, optionally, is configured to be a flat surface region a step lower than a rest flat surface region 120 separated by an edge 101 substantially along a second direction x. The integrated coupler 300 is disposed next to the edge 101. The laser diode flip-chip 400 is configured to be attached into the patterned region 110 to bond with the bond pad 111 while rests against on the vertical stopper 112 and 113. At the same time, the step section along the edge 101 also acts as an edge stopper against an end of the laser diode chip 400.

In a specific embodiment, the tunable filter 200 is configured as a Vernier ring reflector filter. Optionally, the tunable filter 200 is a Si wire waveguide 220 fabricated in the silicon photonics substrate 100. Optionally, the tunable filter 200 is formed in the rest flat surface region 120 beyond the patterned region 110. The Si wire waveguide 220 includes at least two ring resonators 221 and 222. Optionally, the two ring resonators are made with slightly different radii. Optionally, a first ring 221 is coupled to a reflector ring 223 which is also made by a linear section of the Si wire waveguide coupled to a ring-like structure via a 1-to-2 splitter. Optionally, a second ring 222 is coupled to the integrated coupler 300 via a linear wire waveguide 210 made by different material. Optionally, the linear wire waveguide 210 is a SiN based waveguide formed in the same silicon photonics substrate 100.

In the embodiment, the tunable filter 200 further includes a first ring heater (Ring1_HTR) 201 having a thin-film resistive layer overlying the first ring 221, a second ring heater (Ring2_HTR) 202 having a resistive thin-film overlying the second ring 222, and a phase heater (Phase_HTR) 203 overlying the reflector ring 223. By changing temperature through changing voltages supplied to the two ring heaters (201 and 202), multiple resonate peak positions in transmission spectrum through each of the two ring resonators (221 and 222) can be tuned. Since the two rings have different radii, there is an offset between the two transmission spectra when they are superimposed (see FIG. 6). As they go through the reflector ring 223, a reflection light spectrum with a strong peak is produced (see FIG. 7) and tunable by changing temperature through changing voltage supplied to the phase heater (203). Optionally, each heater is made by a resistive thin film geometrically covering each ring-shaped wire waveguide and terminated with two bond pads for bonding to an external power supply.

Figure 10:
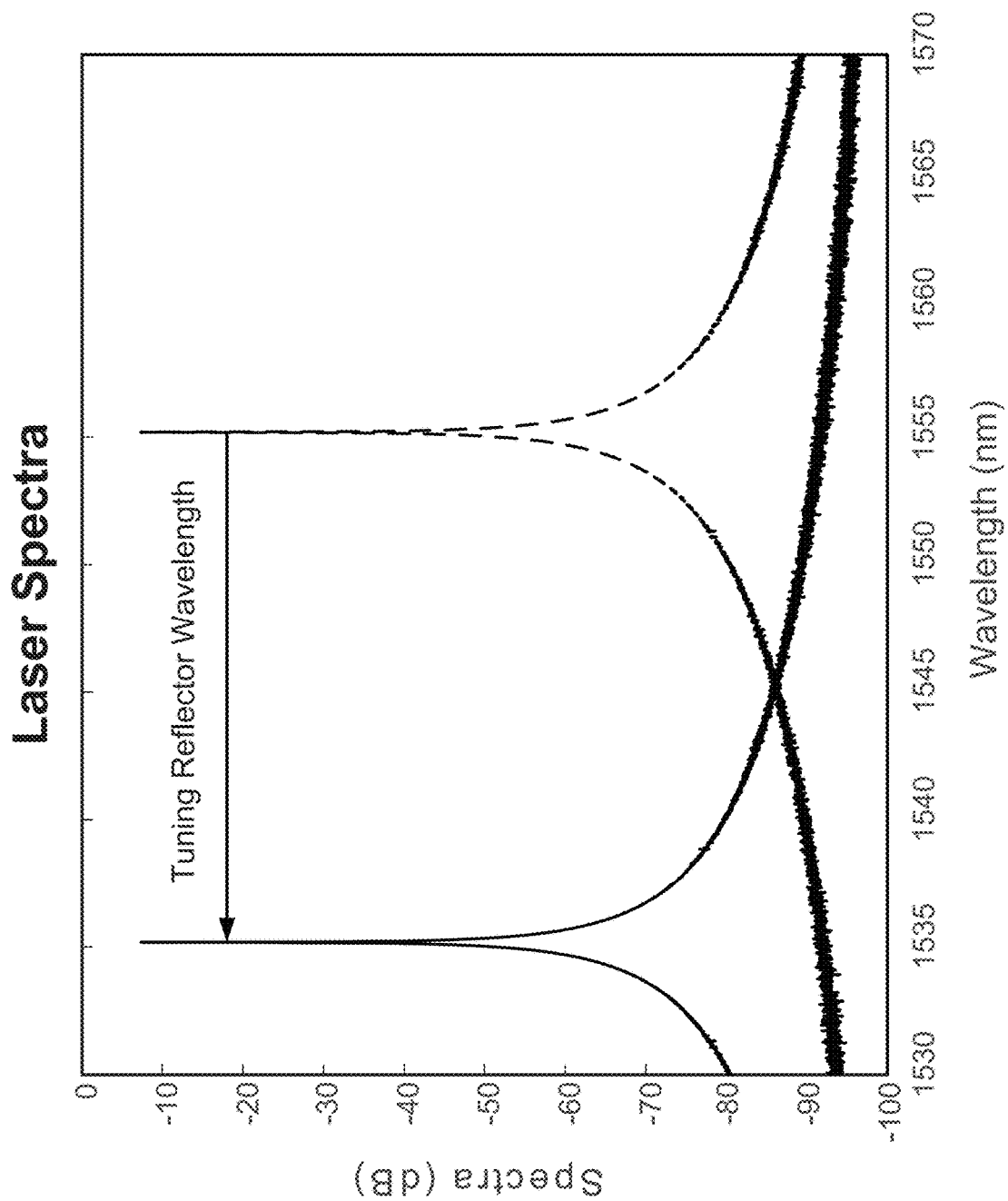
FIG. 10 is an exemplary diagram of laser spectra outputted by the silicon photonics tunable laser device with laser wavelength being tuned from 1555 nm to 1535 nm according to an embodiment of the present invention.

In the embodiment, the laser diode chip 400 includes a gain region. The gain region includes an InP-based active region that is driven to produce a laser light. The laser light, as it is initially generated from the InP active region, is inputted via the integrated coupler 300 and the linear wire waveguide 210 into the tunable filter 200. The light will pass through the at least two ring resonators 222 and 221 and reflected by the reflector 223 back to the gain region of the laser diode chip 400. The reflectivity spectrum, as shown in FIG. 10, yields a strong peak of a laser light at a wavelength. The wavelength is tunable in a wide band range at least from 1560 nm to 1530 nm shown in FIG. 10 by tuning the phase heater 203. The light is outputted as a laser light at a fixed wavelength when the round-trip cavity lasing condition is met if an integral of a whole light path of the tunable laser device 10 equals to N2π ((N is an integer).

Figure 2:
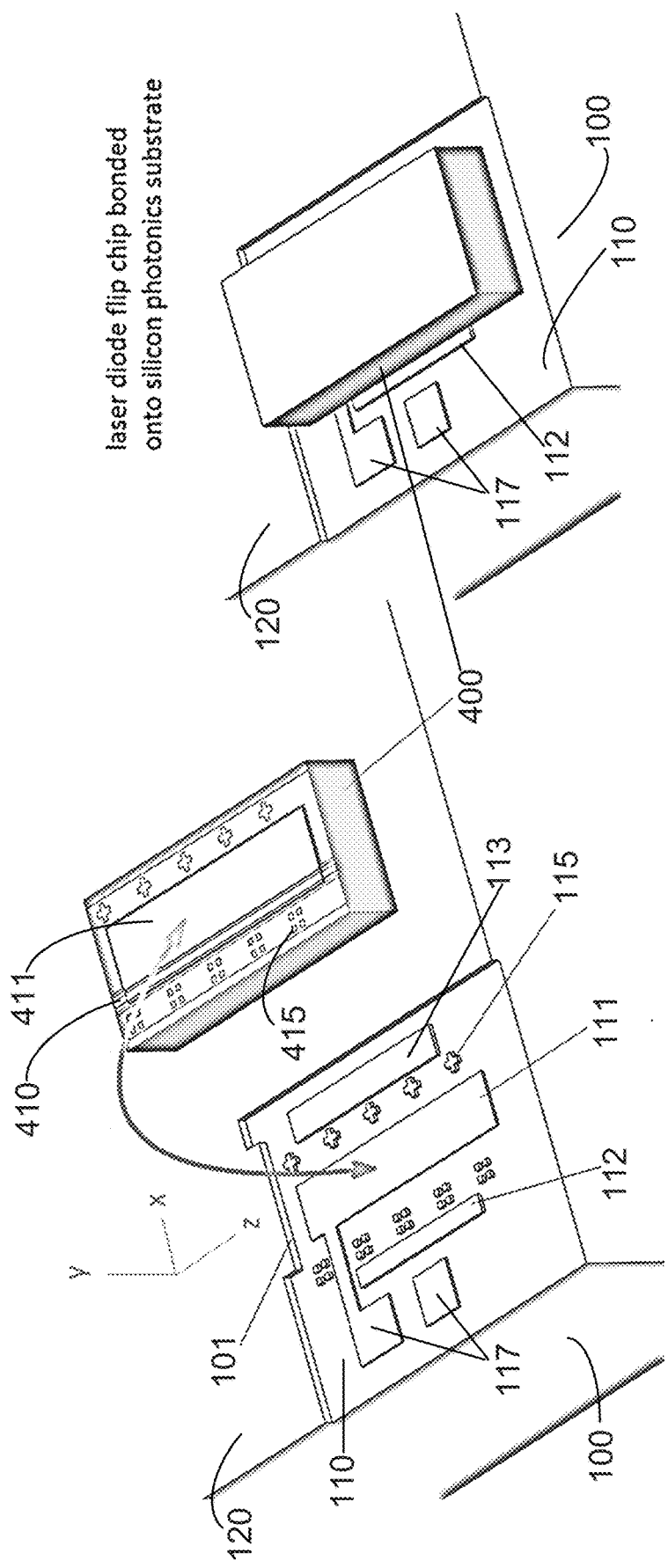
FIG. 2 is a schematic diagram showing a perspective view a laser diode chip flipped bonding to a silicon photonics substrate according to an embodiment of the present invention.

FIG. 2 is a schematic diagram showing a perspective view a laser diode chip flipped bonding to a silicon photonics substrate according to an embodiment of the present invention. This diagram is merely an example, which should not unduly limit the scope of the claims. One of ordinary skill in the art would recognize many variations, alternatives, and modifications. Referring to FIG. 2, a section of a substrate 100 is shown to include a patterned region 110 out of rest flat surface region 120. The patterned region 110 is configured to be a flat region being a step lower than rest flat surface region 120. Along one step an edge stopper 101 is formed facing a first direction z. Optionally, the step is along a second direction x perpendicular to the first direction z. On the patterned region 110, there is a bond pad 111 formed along the first direction z. On both sides of the bond pad 111, there are two vertical stoppers 112 and 113 which are two thin plates having certain heights. Two extended parts 117 of the bond pad 111 are used for bonding with an external source. Further along these vertical stoppers, a plurality of alignment features 115 are formed. Optionally, an alignment feature 115 includes multiple fiducials lined in one or two rows along the first direction z.

In the embodiment, a laser diode chip 400 can be prefabricated with a gain region 410 and a metallic electrode 411 formed on top in an elongated shape. The gain region 410 is formed from one edge to another of the chip. Optionally, the metallic electrode 411 is formed to be in contact with a P-side layer of an active region made by InP-based P-N junction quantum well structure. On two sides of the metallic electrode 411, an alignment feature 415 is formed on the laser diode chip and configured to match the plurality of fiducials of the alignment feature 115 on the patterned region 110. Referring to FIG. 2, the laser diode chip is a flip chip bonded onto the patterned region 110 of the substrate 100. The configurations for both the patterned region 110 and the laser diode chip 400 allow the latter is rest against the vertical stoppers 112 and 113 of the former with one edge of the latter against the edge stopper 101 of the former as the alignment feature 415 of the latter is engaged with the plurality of fiducials 115 of the former.

Figure 3:
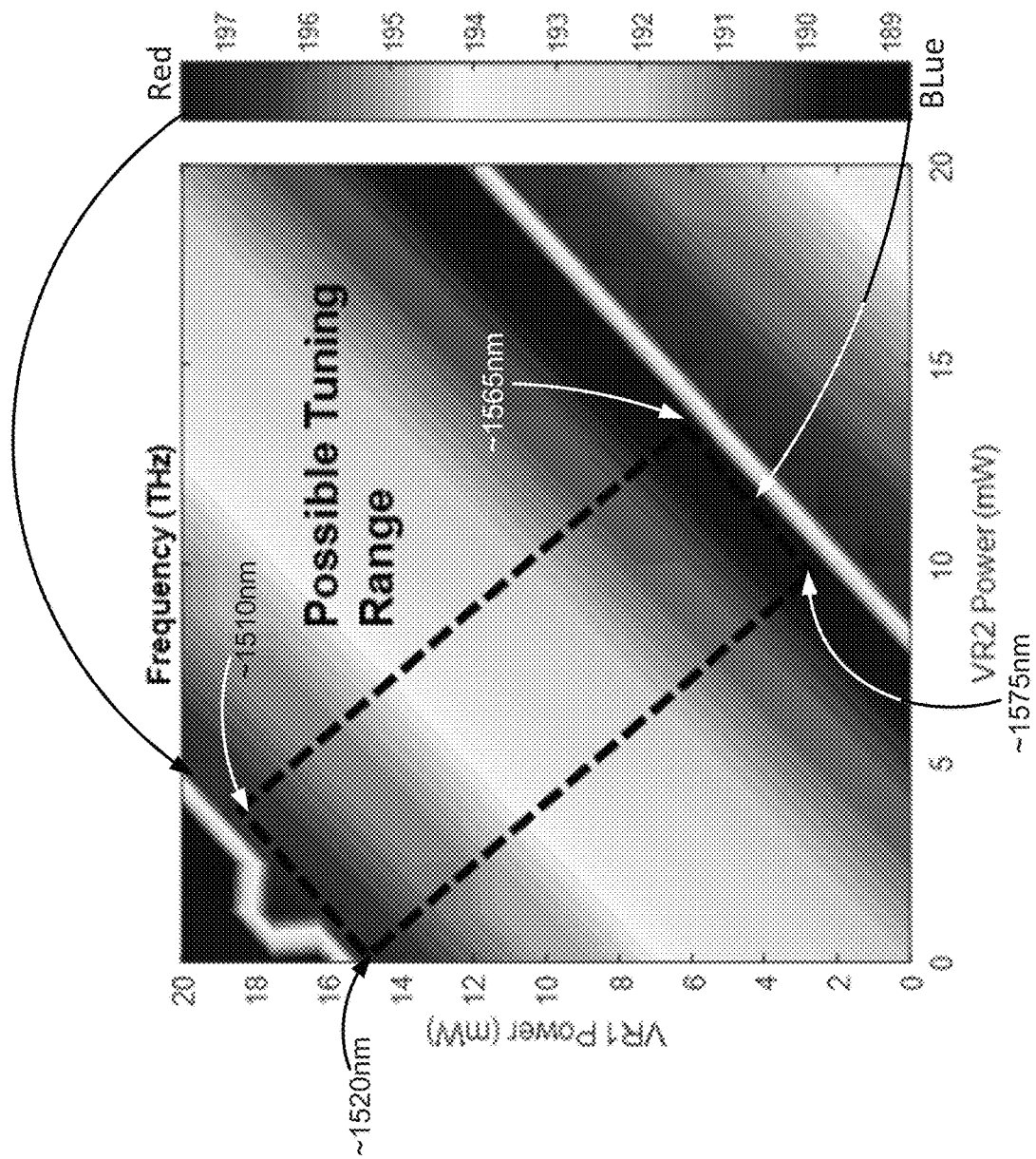
FIG. 3 is an exemplary diagram of a wavelength tuning map of a silicon photonics tunable laser according to an embodiment of the present invention.

FIG. 3 is an exemplary diagram of a wavelength tuning map of a silicon photonics tunable laser according to an embodiment of the present invention. This diagram is merely an example, which should not unduly limit the scope of the claims. One of ordinary skill in the art would recognize many variations, alternatives, and modifications. As shown, the diagram is plotted as spectrum frequency 2D map varied with powers supplied to two power supplies for the two ring heaters in the tunable filter mentioned above. The dashed rectangle gives a possible tuning range. As the two ring resonators are provided with different radii, it effectively yields a extended tunable range for the spectrum wavelength as the two transmission spectra are superimposed when the two ring resonators are physically coupled, for example, in a Vernier ring filter configuration (see FIG. 8). Optionally, the long side of the rectangle provides a relative rough tuning range of wavelength for more than 50 nm, e.g., from ~1520 nm to ~1575 nm, and the short side of the rectangle provides a relative finer tuning range of wavelength for ~10 nm, e.g., from ~1565 nm to ~1575 nm.

Figure 4:
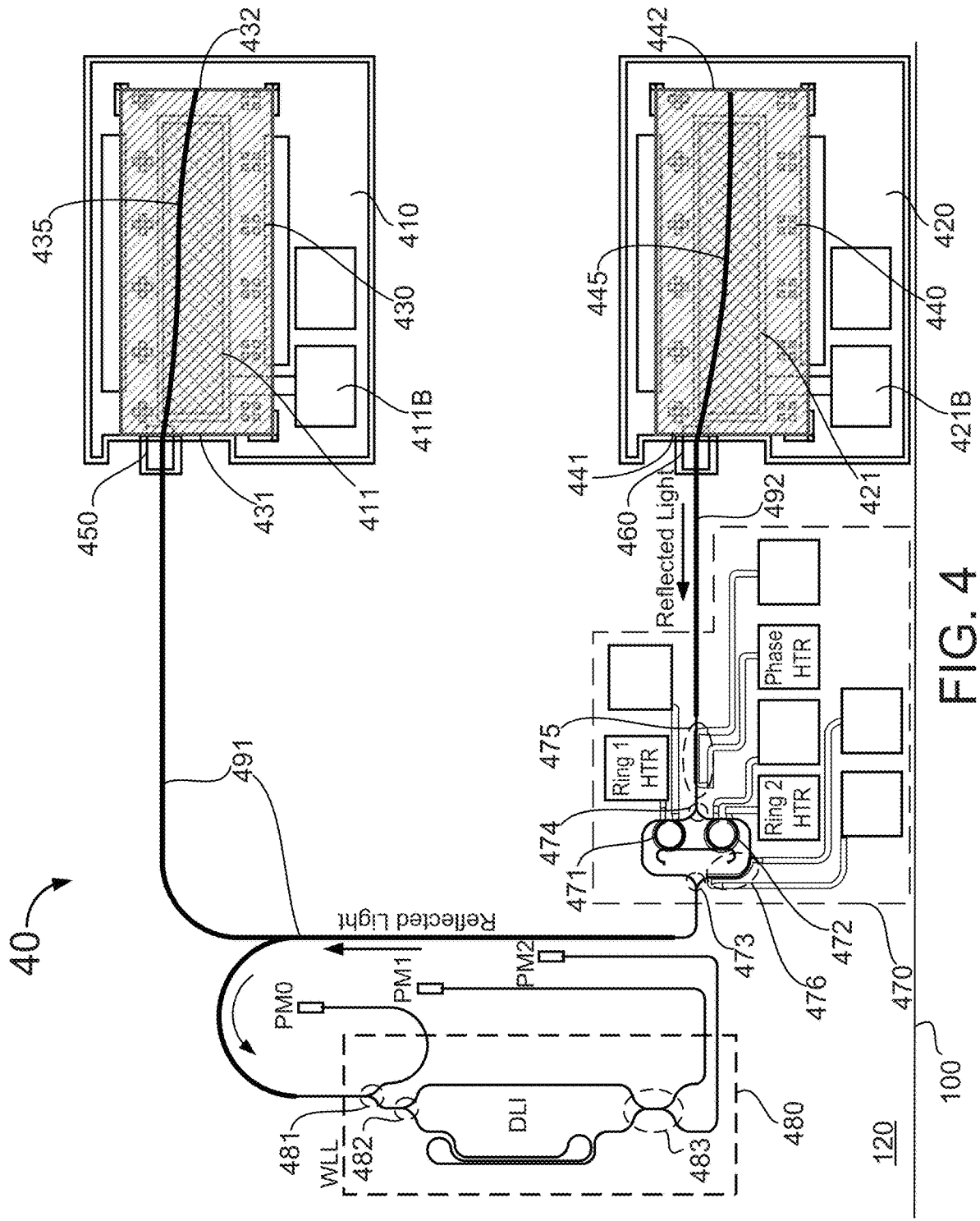
FIG. 4 is a simplified diagram of a silicon photonics tunable laser device according to another embodiment of the present invention.

FIG. 4 is a simplified diagram of a silicon photonics tunable laser device according to another embodiment of the present invention. This diagram is merely an example, which should not unduly limit the scope of the claims. One of ordinary skill in the art would recognize many variations, alternatives, and modifications. As shown, the tunable laser device 40 includes a first laser diode chip 430 bonded onto a first patterned region 410 of a substrate 100, a second laser diode chip 440 bonded onto a second patterned region 420 of the substrate 100, a tunable filter 470 coupled to a first gain region 435 of the first laser diode chip 430 via first integrated coupler 450 and coupled to the second gain region 445 of the second laser diode chip 440 via a second integrated coupler 460, and a wavelength locker 480 configured to lock the wavelength of a reflected light from the second gain region 445 through the tunable filter 470.

Referring to FIG. 1 and FIG. 4, each of the first laser diode chip 430 and the second laser diode chip 440 is substantially configured to be same as one laser diode chip 400 that has a metallic electrode in contact with a P-type layer of corresponding active region and is flipped down to have the metallic electrode bonded with a bond pad of the first patterned region 410 and the second patterned region 420 in the same substrate 100. In particular, the first laser diode chip 430 is configured to be a cavity having a first end facet 431 and a second end facet 432 with the gain region 435 as a wire waveguide along an active region bounded between them. As the first laser diode is flipping (P-side down) bonded to the first patterned region 410, the first end facet 431 is against an edge stopper associated with the first patterned region 410 to be aligned with the first integrated coupler 450. The wire waveguide associated with the first gain region 435 is configured to be in a curved shape with a non-perpendicular angle relative to each of the first end facet 431 and the second end facet 432 to reduce direct back reflection of the light by the corresponding end facet. Optionally, the first end facet 431 includes an anti-reflective coating. Optionally, the second end facet 432 is also coated with an anti-reflective coating. The second laser diode chip 440 is configured to be a cavity having a third end facet 441 and a fourth end facet 442 with the second gain region 445 as a wire waveguide along an active region bounded between the third end facet 441 configured with an anti-reflective coating and the fourth end facet 442 configured with a high-reflectivity coating. As the second laser diode chip is flipping (P-side down) bonded to the second patterned region 420, the first end facet 441 is against an edge stopper associated with the second patterned region 420 to be aligned with the second integrated coupler 460. Optionally, the third end facet 441 is coated by an anti-reflective coating and the fourth end facet 442 is coated by a high-reflectivity coating characterized with at least 90% reflectivity over a wide band (e.g., C-band) to enhance reflection of the light emission in the second gain region 445 and generate a reflected light passing through the third end facet 441. The reflected light can pass through the second integrated coupler 460 back to the tunable filter 470 via a second waveguide 492 so that the cavity of the second gain region 445, in addition to provide gain to the reflected light, acts also as a ring reflector of the tunable filter in substantially a Vernier ring reflector configuration.

In the embodiment, the tunable filter 470 is a Si wire waveguide fabricated in the substrate 100 particularly in a region 120 beyond the first patterned region 410 and the second patterned region 420. The tunable filter 470 includes two ring resonators, a first ring resonator 471 and a second ring resonator 472 coupled to each other. The two ring resonators are coupled to the first waveguide 491 via a 2-to-1 coupler 473 and coupled to the second waveguide 492 via another 2-to-1 coupler 474. Optionally, the 2-to-1 coupler is still in waveguide form with one port in one end and two ports in opposite end. Optionally, it is a splitter from one-port end to two-port end or a combiner from two-port end to the one-port end. Both the first waveguide 491 and the second waveguide 492 are fabricated in the region 120 of the substrate 100 to couple respective with the first integrated coupler 450 and the second integrated coupler 460. The first integrated coupler 450 is disposed next to the edge stopper associated with the first patterned region 410. The second integrated coupler 460 is disposed next to the edge stopper associated with the second patterned region 420. Optionally, each of the first waveguide 491 and the second waveguide 492 is made by SiN material embedded in a Si-based substrate 100.

Optionally, the wire waveguide of the tunable filter 470 is made by Si material.

Referring to FIG. 4, the tunable filter 470 further includes a first heater (Ring1_HTR) having a resistive thin-film overlying the first ring resonator 471, a second heater (Ring2_HTR) having a resistive thin-film overlying the second ring resonator 472, a third heater (Phase_HTR) having a resistive thin-film overlying a phase shifter section 475 of the Si wire waveguide that is connected with the second waveguide 492. These heaters are configured to change temperature to cause a change of transmission spectrum of the light passing through respective ring resonators. Each transmission spectrum of the ring resonator has multiple resonate peaks (see FIG. 6). In an embodiment, the two ring resonators, 471 and 472, are provided with slightly different radii, then an offset between the two transmission spectra exists when they are superimposed (see FIG. 6). The first heater and the second heater can be controllably change temperatures of the respective first ring resonator and the second ring resonator to cause respective resonate peaks to shift to provide an extended tunable range of the wavelengths of those resonate peaks. After the light is reflected back by the cavity of the second gain region 445, a reflectivity spectrum gives a stronger central peak (see FIG. 7), which is further tunable by changing temperature of the phase shifter section 475 using the third heater. In this case, the second gain region 445 acts as a ring reflector as the tunable filter 470 is configured to be a Vernier ring reflector while the phase shifter section 475 is formed next to the reflector instead of separated from the reflector as shown in FIG. 8.

Optionally, the tunable filter 470 includes a fourth heater having a resistive thin-film overlying a section 476 of one branch of the 1-to-2 coupler 473 for finely balance power of light split from the first waveguide 491 into the two branches respectively coupled to two ring resonators 471 and 472.

In the embodiment, the wavelength locker 480 is configured to be a delay line interferometer (DLI) based on Si waveguide formed in the substrate 100. Optionally, the wavelength locker 480 includes an input port coupled via a splitter to the first waveguide 491 to receive the reflected light from the tunable filter 470. Optionally, one end of the input port is a SiN waveguide coupled to the first waveguide 491 which is also made by SiN material. Another end of the input port connects to a 1-to-2 splitter 481 to guide one part of the light into a monitor port PM0 and another part of the light into the DLI via another 1-to-2 splitter 482. The light then comes out of the DLI via a 2-to-2 splitter 483 to a first interference output port PM1 and a second interference output port PM2. In the embodiment, the wavelength locker 480 is pre-calibrated to set the DLI for locking the wavelength (of the reflected light from the tunable filter) to certain channel wavelengths of a wide band. Optionally, the channel wavelengths are ITU channels in C-band. Of course, the disclosure of the tunable laser can be applied to other wide band other than C-band, like the O band. Optionally, each of the monitor port PM0, the first interference output port PM1, and the second interference output port PM2 is terminated with a photodiode for measuring light power in terms of photocurrent. A differential signal characterized by a photocurrent difference between PM1 and PM2 over the sum of them is collected to be an error signal fed back to drivers for the first laser diode chip and the second laser diode chip to adjust wavelength of light. Ideally, when the wavelength is adjusted or locked to a desired ITU channel pre-calibrated for the wavelength locker, the error signal should be zero, i.e., PM1=PM2.

Figure 5:
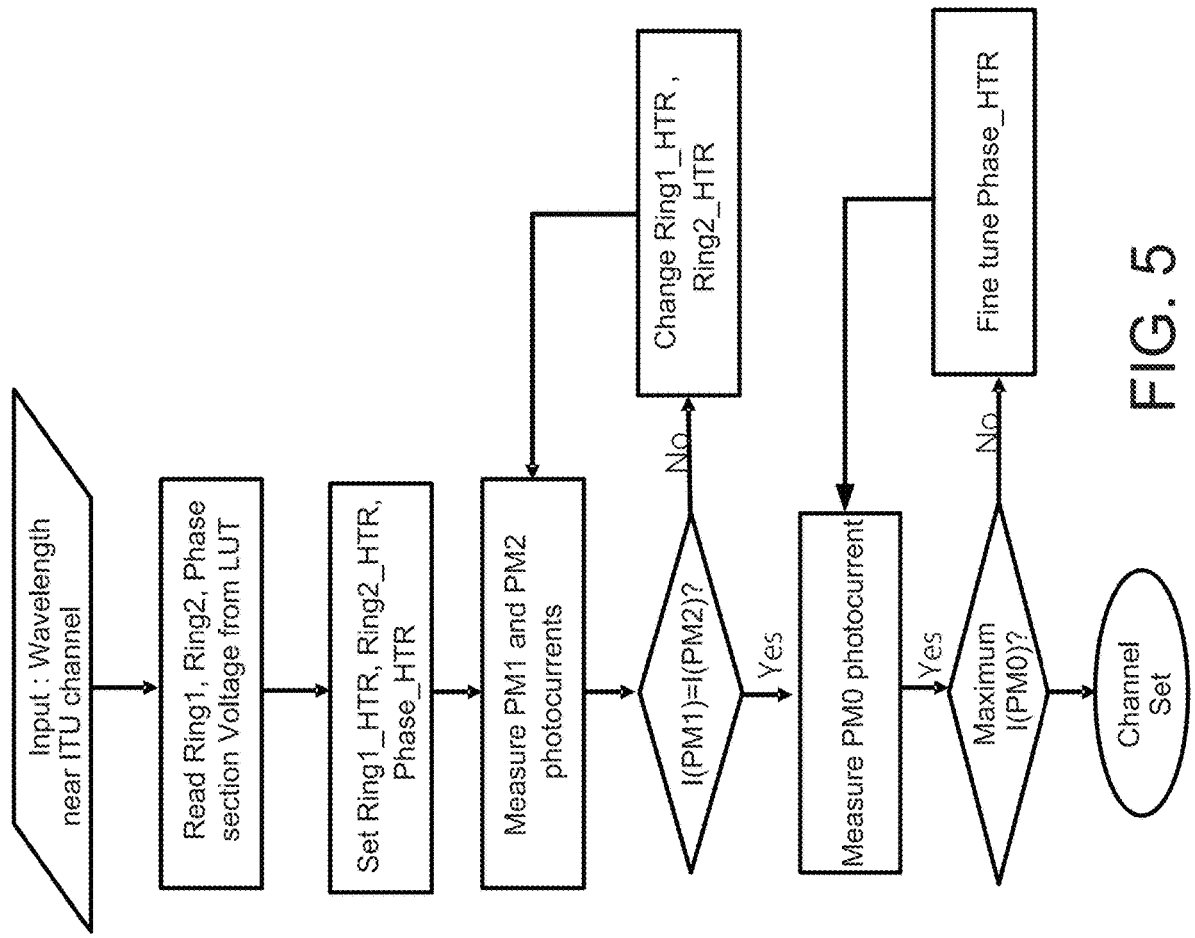
FIG. 5 is a flowchart of a method for tuning wavelength of a laser output of the silicon photonics tunable laser device according to an embodiment of the present invention.

In another aspect, the present disclosure also provides a method for tuning wavelengths of a silicon photonics based tunable laser device described hereabove. FIG. 5 is a flowchart of a method for tuning wavelength of a laser output of the silicon photonics tunable laser device according to an embodiment of the present invention. As shown, the method includes a step of generating a light with a wavelength near ITU channels (for example, in C-band) in a dual-gain configuration including a first active region and a second active region. Referring back to FIG. 4, in a specific embodiment, a first laser diode chip having a first metallic electrode 411 in contact with a P-type layer of the first active region 435 is provided and a second laser diode chip having a second metallic electrode 421 in contact with a P-type layer of the second active region 445 is provided. Further, the first laser diode chip to have the first metallic electrode 411 is flipping bonded with a bond pad 411B in a first patterned region 410 of a substrate to align the first active region 435 to a first integrated coupler and the second laser diode chip to have the second metallic electrode 421 is flipping bonded with a bond pad 421B in a second patterned region 420 of the substrate to align the second active region 445 to a second integrated coupler. The first active region 435 and the second active region 445 are connected via the silicon photonics tunable filter 470 to form a combined resonate cavity. Referring to FIG. 5, the method includes driving the first laser chip and the second laser diode chip to generate the light in the combined resonate cavity. In particular, the method includes a step of inputting the light with gain from the second active region 445 of a second laser diode chip driven by its driver. The light, after reflected from a high-reflectivity facet 442 of the second active region 445, is coupled via the second integrated coupler 460 into the second waveguide 492 which guides the light to the silicon photonics based tunable filter 470. The method further includes reflecting the light with additional gain from a second active region of a second laser diode chip. The reflected light with gain from the second active region 445 further passes through the second integrated coupler 460 and back to the tunable filter via a second waveguide 492. Additionally, the light, after its wavelength tuned by the tunable filter 470, is delivered via a first waveguide 491 through the first integrated coupler 450 into the first active region 435 to have additional gain, achieving dual gains through the round-trip path of the combined resonate cavity.

The light after being amplified with the additional gain in the first active region 435 will be lasing out of the second end facet 432.

Additionally, the tunable filter 470 is configured to have a first ring resonator Ring1, a second ring resonator Ring2, and a Phase shifter section. The method further includes a step of setting respectively a first heater associated with the first ring resonator, a second heater associated with the second ring resonator, and a third heater associated with the phase shifter to set the wavelength near an ITU channel. Respectively, the first heater, the second heater, and the third heater are configured to be resistive thin films formed in the substrate to cover at least partially the first ring resonator Ring1, the second ring resonator Ring2, and the Phase shifter section. Each of these heaters can be controlled by voltages applied to two coupling electrodes from an external power supply. In a specific embodiment, the step includes reading voltages respectively set from the first heater, the second heater, and the third heater from a preset look-up-table (LUT). The voltages read from the LUT are substantially correlated with the corresponding ITU channel. For example, some specific voltage values are preset for wavelength at 1535 nm in C-band. Further, the step includes applying voltages read from the LUT respectively to the first heater and the second heater to respectively set two transmission spectra of the first ring resonator and the second ring resonator to obtain a synthesized spectrum with a strong peak wavelength in an extended tunable range. For example, the extended tunable range can be varied from 1520 nm to 1570 nm. In another example, when the gain profile is relatively limited, the extended tunable range can be at least varied from 1535 nm to 1565 nm. Furthermore, the step includes applying a voltage read from the LUT to the third heater to set a phase of a reflectivity spectrum with the strong peak wavelength in the extended tunable range. The reflection spectrum is set substantially based on the synthesized spectrum.

Optionally, the method further includes monitoring photocurrents at a monitor port split from the input port, a first interference output port, and a second interference output port of the wavelength locker (see FIG. 4) based on the light reflected from the second active region and filtered by the tunable filter. Each of the monitor port, the first interference output port, and the second interference output port is respectively terminated with a photodiode (such as PM0, PM1, and PM2, see FIG. 4). Each of these photodiodes generates a photocurrent as a measurement of the light power thereof, which can be monitored in real time. An error signal based on a differential light power between the first interference output port and the second interference output port can be used as a feedback for tuning light wavelength to be locked to a pre-calibrated wavelength, e.g., an ITU channel.

Furthermore, the method includes tuning the first heater and the second heater to coarsely tune the transmission spectrum through each of the first ring resonator and the second ring resonator until the photocurrents at the first interference output port and the second interference output port are equal. Since slightly different radii are assigned for the first ring resonator and the second resonator, an offset exists between the two transmission spectra. A synthesized spectrum can be obtained by superimposed the two transmission spectra, which includes at least one strong peak as two transmission peaks of two ring resonators are falling to a same wavelength. By tuning both the first heater and the second heater, the position of this strong peak in the synthesized spectrum is shifted in the extended tunable range. When the photocurrents at the first interference output port and the second interference output port are equal, it means the peak wavelength is substantially tuned to match a pre-calibrated wavelength locked by the wavelength locker as the error signal becomes zero. Of course, the wavelength locker 480 can be configured to in different manners for achieving the wavelength locking function in combination with the tunable filter 470 configured as a Vernier ring reflector. Many of the different silicon photonics based wavelength locker configurations can be referred to a U.S. Pat. No. 10,056,733 commonly assigned to Inphi Corporation.

The method further includes tuning the third heater to finely tune reflection spectrum by maximizing the photocurrent of the monitor port of the wavelength locker representing a maximum gain from a round trip cavity lasing condition associated with both the first active region and the second active region. The Phase shifter section of the tunable filter is located at a straight section of Si wire waveguide outside the two ring resonators. When the third heater, which is placed at least partially over the Phase shifter section, is tuned to change temperature of the Phase shift section, a phase of the reflected light can be tuned in accordance with the whole round-trip path of the light between the first active region and the second active region. The lasing condition is a maximum gain obtained under the physical setup of the optical path between the first active region and the second active region and phase optimized by the Phase shift section, which is characterized by the maximum power measured by photocurrent at the monitor port of the wavelength locker. The enlarged cavity with two active regions over a single active region certainly enhances lasing power of the tunable laser device.

Figure 6:
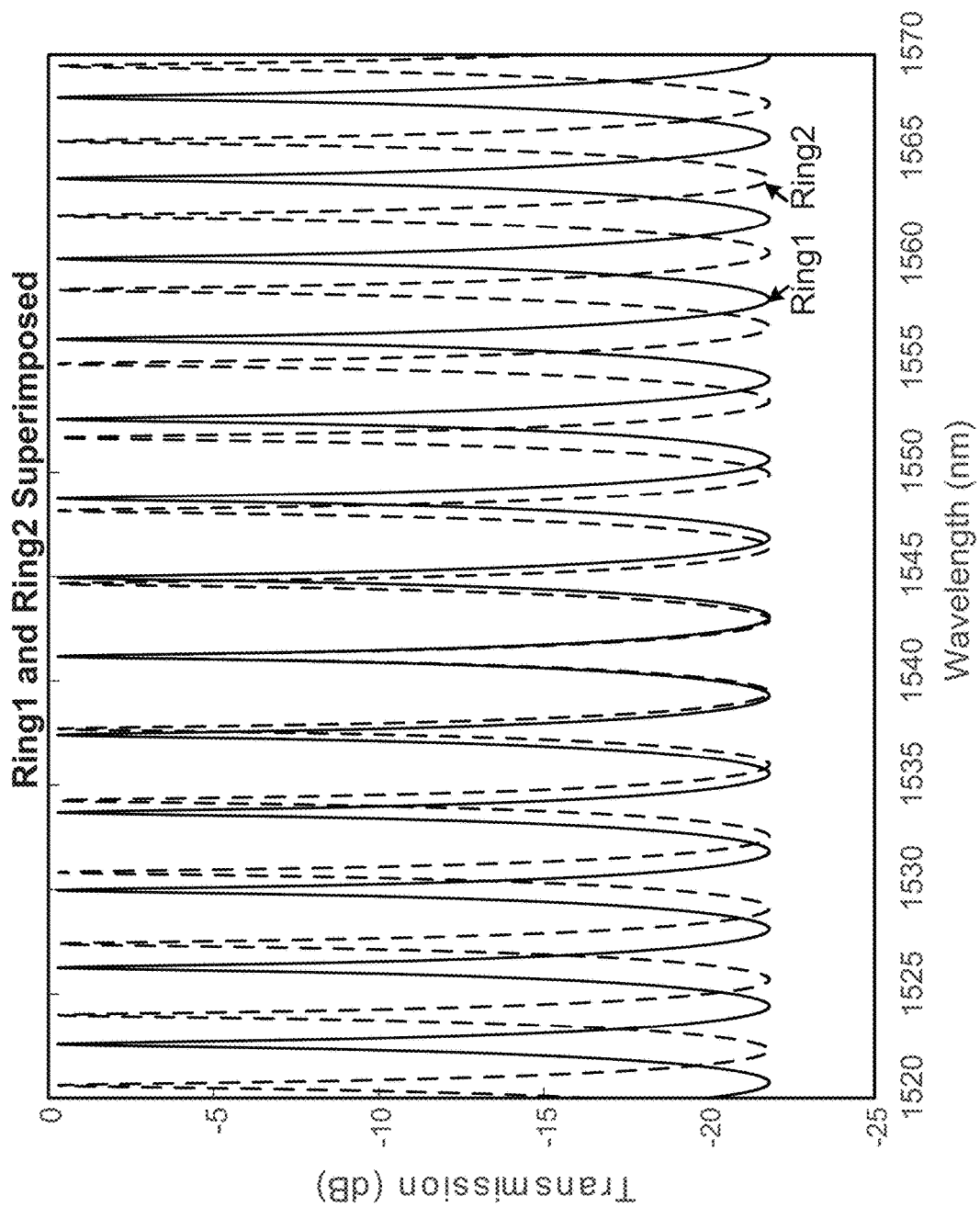
FIG. 6 is an exemplary diagram of two superimposed transmission spectra of respective two ring resonators with different radii of a tunable filter in the silicon photonics tunable laser device according to an embodiment of the present invention.

FIG. 6 is an exemplary diagram of two superimposed transmission spectra of respective two ring resonators with different radii of a tunable filter in the silicon photonics tunable laser device according to an embodiment of the present invention. This diagram is merely an example, which should not unduly limit the scope of the claims. One of ordinary skill in the art would recognize many variations, alternatives, and modifications. As shown, each transmission spectrum of a ring resonator contains multiple peaks with a certain spacing depended on the radius of the ring. Since, two different radii are provided for Ring1 and Ring2, which results in two different spectra-free-ranges (SFRs), there is an offset between the two transmission spectra. Yet, two specific peaks respectively from the two transmission spectra may fall to a substantially common wavelength, for example, ~1540 nm.

Figure 7:
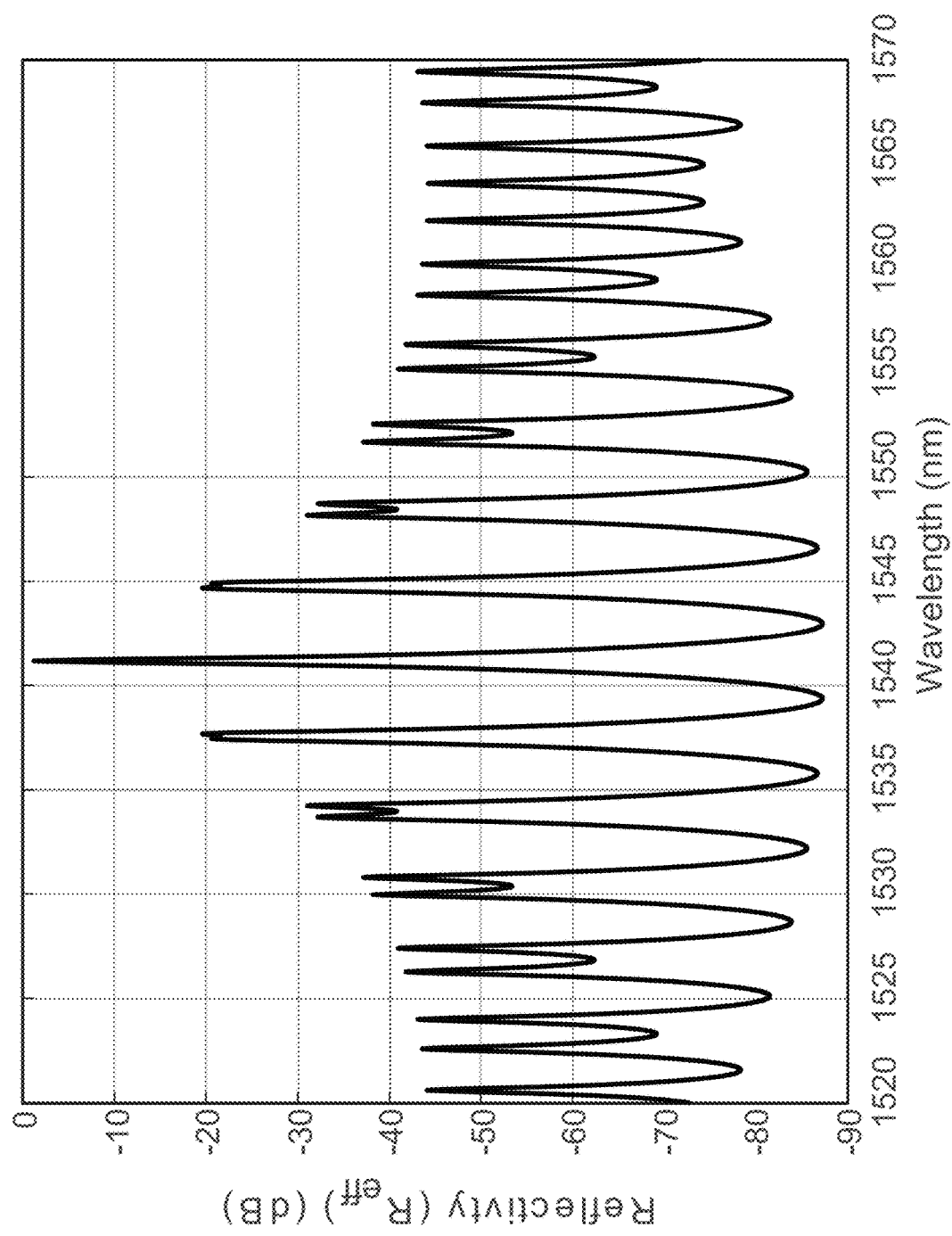
FIG. 7 is an exemplary diagram of a reflectivity spectrum of a reflector coupled to the two ring resonators of the tunable filter according to the embodiment of the present invention.
Figure 8:
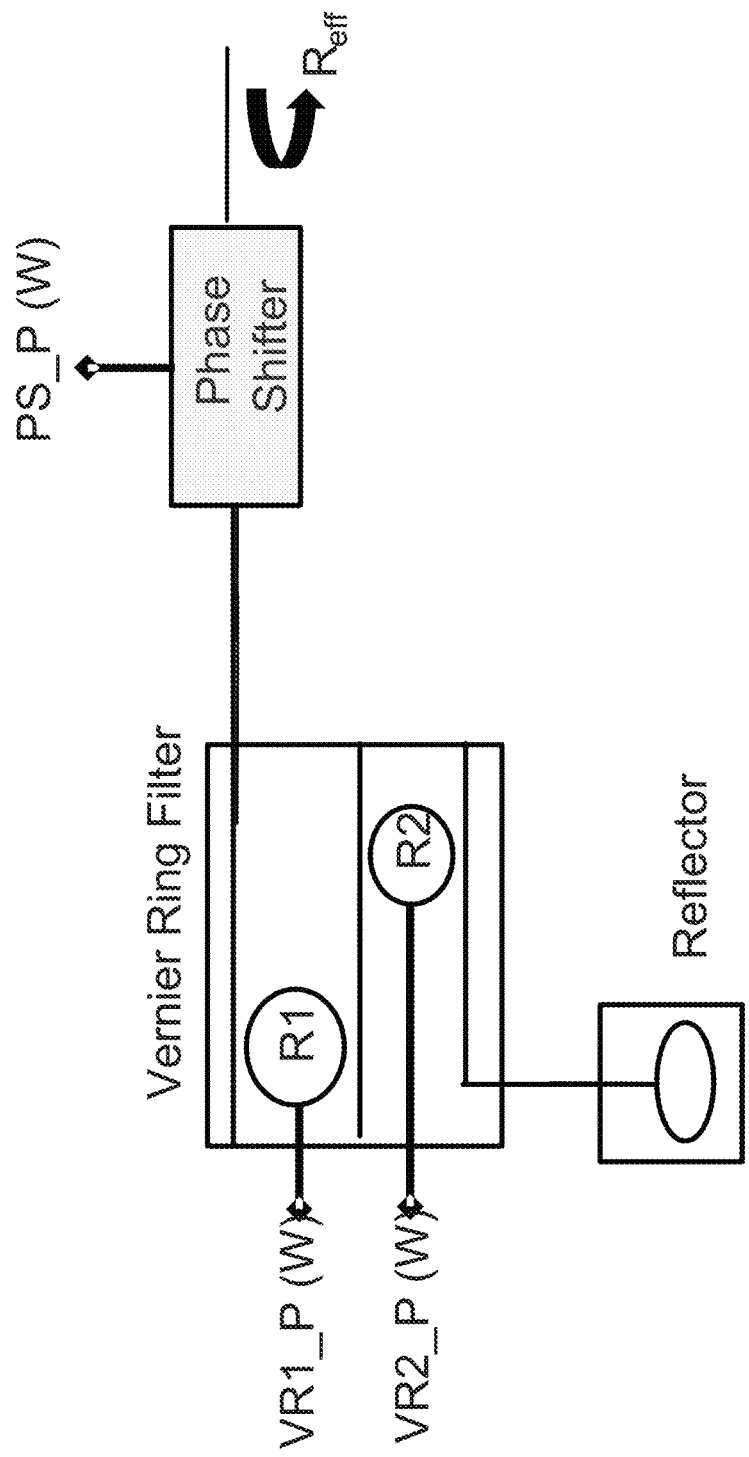
FIG. 8 is a simplified block diagram of the tunable filter including two ring resonators, a reflector, plus a phase shifter in a Vernier ring reflector configuration according to an embodiment of the present invention.

FIG. 7 is an exemplary diagram of a reflectivity spectrum of a reflector coupled to the two ring resonators of the tunable filter according to the embodiment of the present invention. This diagram is merely an example, which should not unduly limit the scope of the claims. One of ordinary skill in the art would recognize many variations, alternatives, and modifications. After the two transmission spectra are superimposed as light passing the two ring resonators is recombined in the single straight section of the wire waveguide and reflected from the second active region, a reflection spectrum is obtained which is substantially based on a synthesized spectrum of the two transmission spectra. As shown, the reflection spectrum is characterized by at least one strong peak at a wavelength, e.g., ~1540 nm.

FIG. 8 a simplified block diagram of the tunable filter including two ring resonators, a reflector, plus a phase shifter in a Vernier ring reflector configuration according to an embodiment of the present invention. This diagram is merely an example, which should not unduly limit the scope of the claims. One of ordinary skill in the art would recognize many variations, alternatives, and modifications. As shown, the tunable filter includes three sections: two ring resonators and phase control sections. The two ring resonators have slightly different FSRs, which allows for extension of the tuning range to the lowest common multiple of the FSRs through the Vernier effect. One phase control section is a loop reflector formed by a loop waveguide and a directional coupler. Optionally, the loop reflector can be replaced by a cavity facet of another laser diode chip. Another phase control section can be simply a section of waveguide with an added heater for directly tuning phase based on thermal optical effect. A reflection spectrum is substantially a synthesized spectrum obtained by superimposing two ring spectra. External laser cavity is configured between the facet of the (first laser diode chip) active region and a loop reflector. When the peaks of the transmission spectrum through the rings are identical and the phase is adjusted on the peak of the rings, lasing operation is occurred. Of course, there are multiple variations of the tunable filter configuration in terms of a setup of the ring resonators and phase control sections, resulting different synthesized spectrum.

Figure 9:
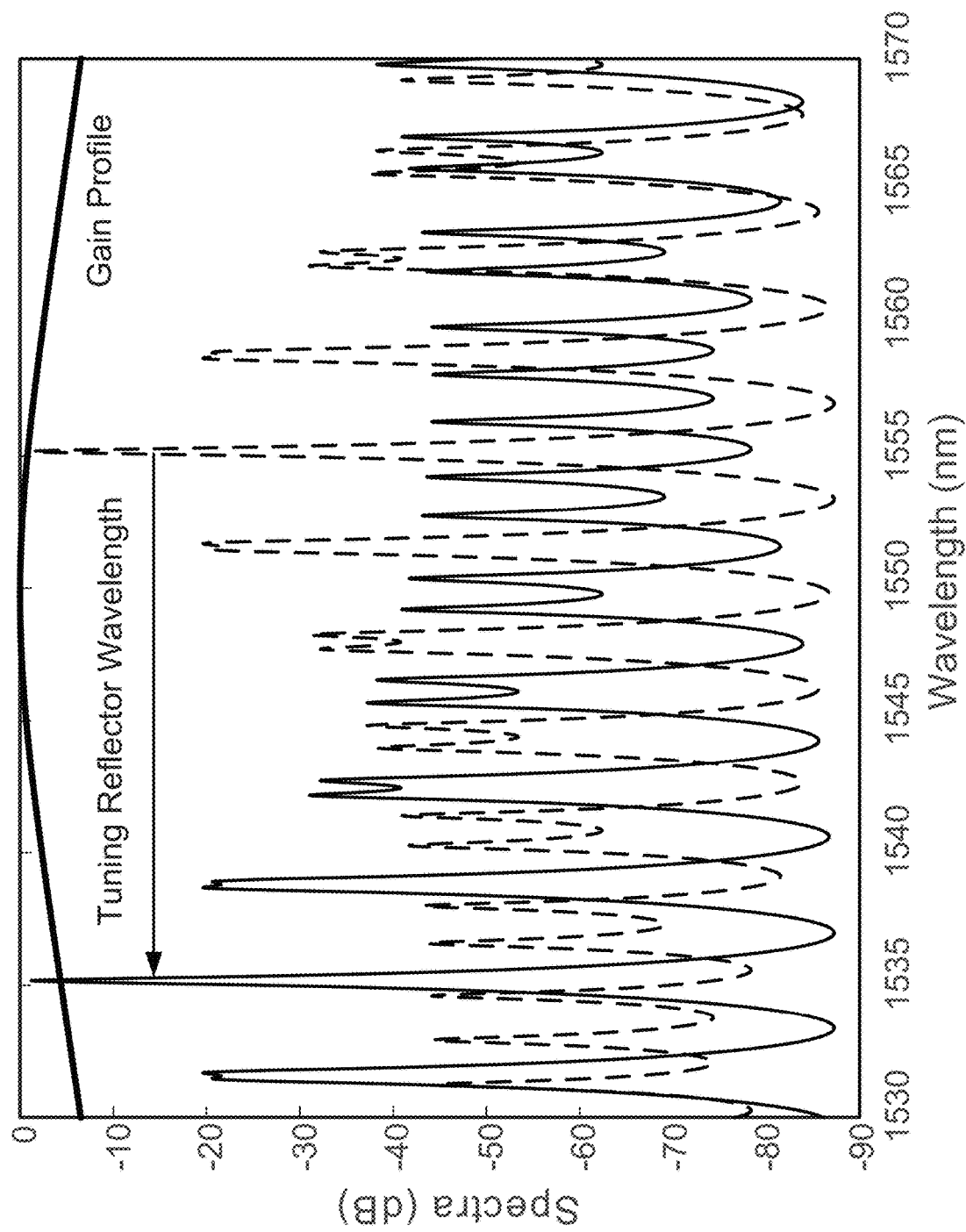
FIG. 9 is an exemplary diagram of two synthesized spectra respectively corresponding to wavelengths being tuned from 1555 nm to 1535 nm by tuning the tunable filter in Vernier ring reflector configuration and corresponding gain profile from 1530 nm to 1570 nm according to the embodiment of the present invention.

FIG. 9 is an exemplary diagram of two synthesized spectra respectively corresponding to wavelengths being tuned from 1555 nm to 1535 nm by tuning the tunable filter in Vernier ring reflector configuration and corresponding gain profile from 1530 nm to 1570 nm according to the embodiment of the present invention. This diagram is merely an example, which should not unduly limit the scope of the claims. One of ordinary skill in the art would recognize many variations, alternatives, and modifications. As shown, the synthesized spectrum is characterized by a strong peak due to superimposing two transmission spectra with common multiple peak wavelength for different SFRs. The peak position, or wavelength value, can be tuned by tuning the Vernier ring reflector around an optimal central position in an extended tunable range.

FIG. 10 is an exemplary diagram of laser spectra outputted by the silicon photonics tunable laser device with laser wavelength being tuned from 1555 nm to 1535 nm according to an embodiment of the present invention. This diagram is merely an example, which should not unduly limit the scope of the claims. One of ordinary skill in the art would recognize many variations, alternatives, and modifications. As shown, the laser wavelength is indicated by the peak of the spectra, which can become tunable across C-band (or other wide band) by tuning the Vernier ring reflector response. In the example, the laser wavelength is tuned from 1555 nm to 1535 nm. The tunable filter based on Vernier ring reflector configuration acts as wavelength selective filter for the gain profile. The center or optima position of the gain profile can be initially preset by setting the optimal temperatures using pre-calibrated voltages supplied to the resistive heaters associated with the Ring1, Ring2, and Phase shift section. For example, the pre-calibrated voltages can be stored in a look-up-table of a memory, which can be read every time for initialing the silicon photonics based tunable laser device. Coarse wavelength tuning can be achieved by changing temperatures around the Ring1 and the Ring2 to tune the wavelength in an extended tunable range around the optimal gain profile position set by the initial settings of the heaters associated with the Ring1, Ring2, and the Phase shift section. Fine wavelength tuning can be done by changing temperature around the Phase shift section. The laser regions also have a wavelength dependent gain profile which is much wider than those from the rings.

Figure 11:
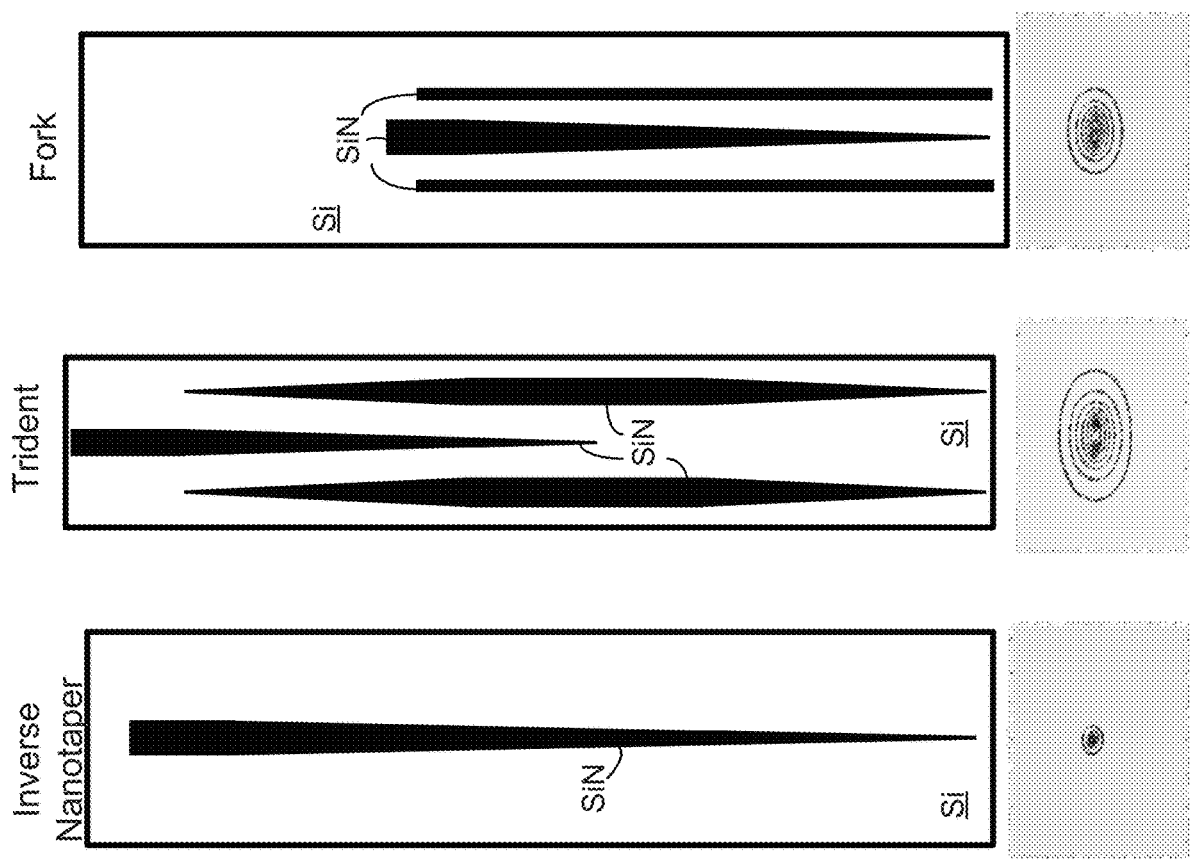
FIG. 11 is a schematic diagram of three types of an integrated coupler based on SiN in Si waveguide according to some embodiments of the present invention.

FIG. 11 is a schematic diagram of three types of an integrated coupler based on SiN in Si waveguide according to some embodiments of the present invention. This diagram is merely an example, which should not unduly limit the scope of the claims. One of ordinary skill in the art would recognize many variations, alternatives, and modifications. Like the FSRs, the coupling coefficients of the tunable filter with two ring resonators are important parameters in order to achieve large modal gain-difference for obtaining enough high side-mode suppression ratio to other modes. One key factor to determine the coupling coefficient is the alignment of light mode confined in the integrated coupler with the incoming laser light beam. On the other hand, tolerance to misalignment existed with different integrated coupler designs would be an advantage for enhance productivity of the tunable laser device.

Referring to FIG. 11, a first type of integrated coupler design is an Inverse Nanotaper structure made by SiN material embedded in a Si waveguide with a sharp needle pointing toward a waveguide end. A small mode diameter is shown for this design, giving large coupling loss in response to a relatively small misalignment. A second type of integrated coupler design is a Trident structure made by SiN material embedded in a Si waveguide. The SiN Trident structure includes an SiN nanotaper sandwiched in partial length laterally by two SiN symmetrical nanotapers that are extended up to the waveguide end of the coupler. A large mode diameter for this design is shown, giving lower coupling loss induced by misalignment. A third type of integrated coupler design is a Fork structure made by SiN material embedded in a Si waveguide. The Fork structure includes an SiN nanotaper sandwiched in full length laterally by two SiN linear stripes up to the waveguide end. It has a medium sized mode diameter yet giving a smallest coupling loss especially for smaller misalignment between the light mode and the laser spot.

Figure 12A:
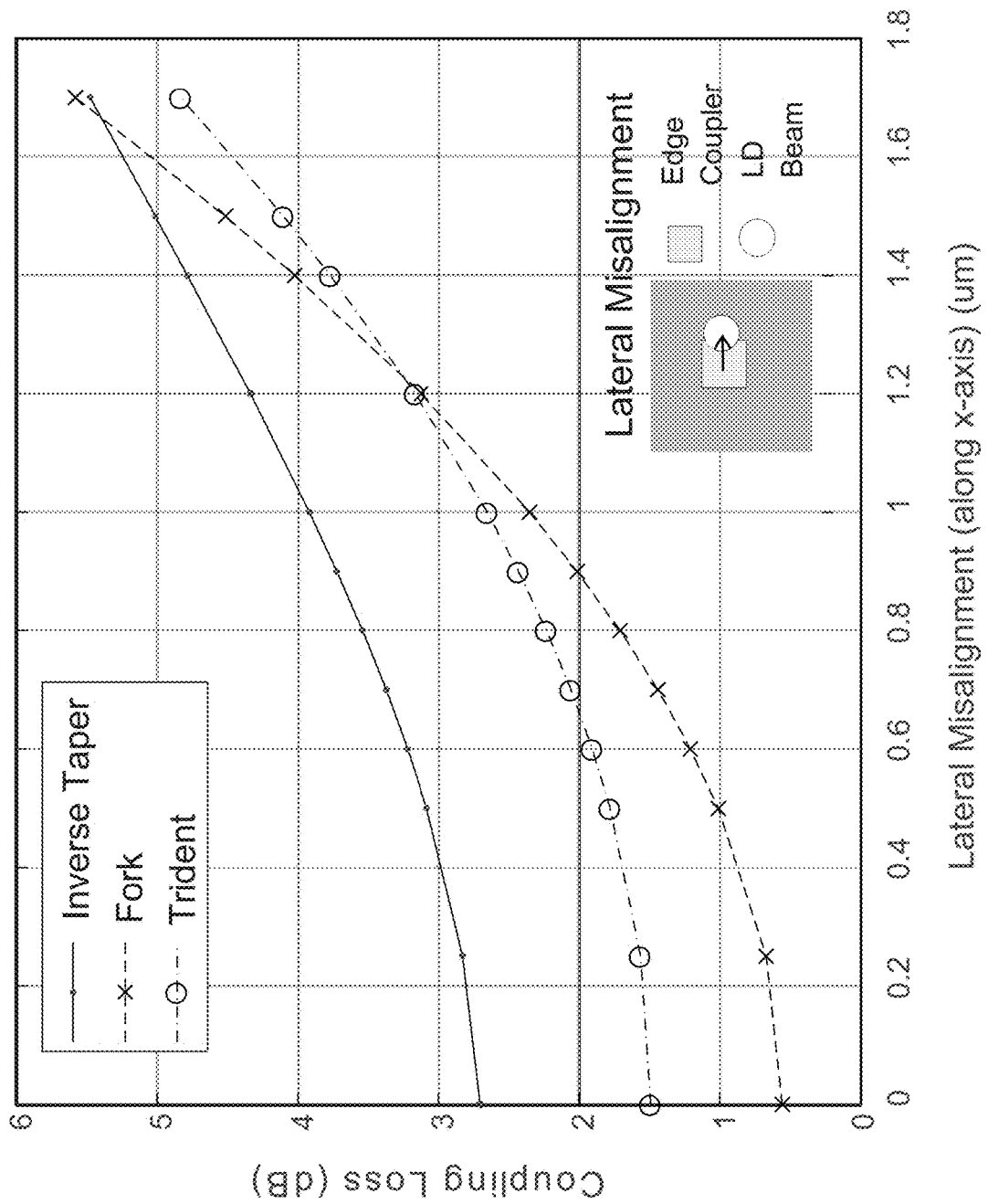
FIG. 12A is an exemplary diagram of a relationship between coupling loss and a lateral misalignment for an integrated coupler coupled between the tunable filter and a laser diode chip according to an embodiment of the present invention.
Figure 12B:
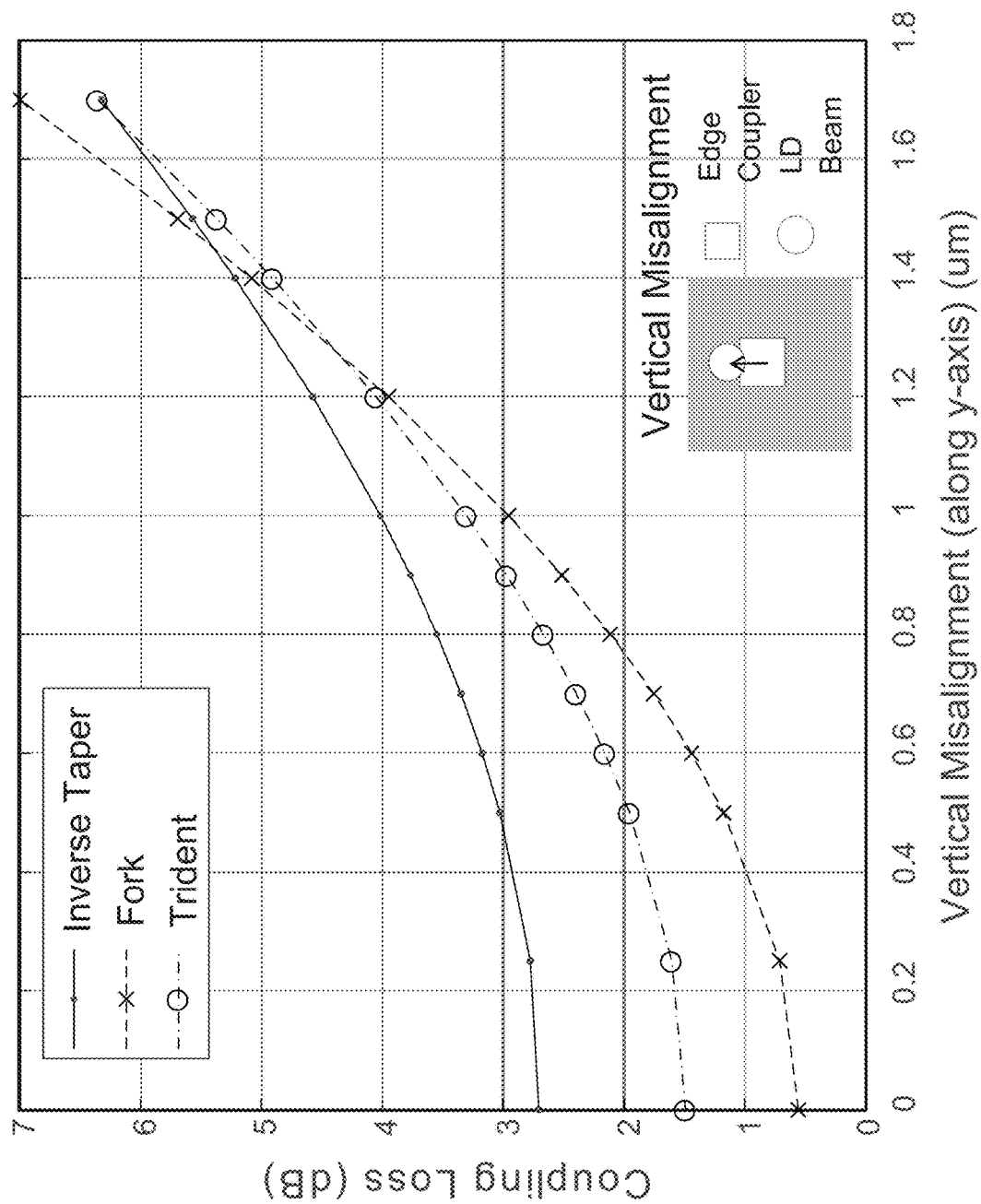
FIG. 12B is an exemplary diagram of a relationship between coupling loss and a vertical misalignment for the integrated coupler coupled between the tunable filter and a laser diode chip according to the embodiment of the present invention.

FIG. 12A is an exemplary diagram of a relationship between coupling loss and a lateral misalignment for an integrated coupler coupled between the tunable filter and a laser diode chip according to an embodiment of the present invention. This diagram is merely an example, which should not unduly limit the scope of the claims. One of ordinary skill in the art would recognize many variations, alternatives, and modifications. As shown, SiN Trident and SiN Fork type integrated couplers offset lower coupling loss alternative to SiN Inverse Nanotaper type integrated coupler with comparable tolerance to misalignment in lateral axis between a laser beam coming out of the laser diode chip and mode diameter of the integrated coupler. In the example, the coupling loss from mode mismatch based on 2.5 µm laser diode spot size. FIG. 12B is an exemplary diagram of a relationship between coupling loss and a vertical misalignment for the integrated coupler coupled between the tunable filter and a laser diode chip according to the embodiment of the present invention. This diagram is merely an example, which should not unduly limit the scope of the claims. One of ordinary skill in the art would recognize many variations, alternatives, and modifications. As shown, SiN Trident and SiN Fork type integrated couplers offset lower coupling loss alternative to SiN Inverse Nanotaper type integrated coupler with comparable tolerance to misalignment in vertical axis between a laser beam coming out of the laser diode chip and mode diameter of the integrated coupler. Additionally, the SiN Fork type integrated coupler offers more compact design than SiN Trident type integrated coupler with lower coupling loss (e.g., less than 1 dB). In an example, the Fork type integrated coupler has just half length of the Trident type integrated coupler. In an example, the coupling loss for the Fork type is just half of that for Trident type when the mis-alignment is less than 0.6 µm in both lateral or vertical direction.

Figure 13:
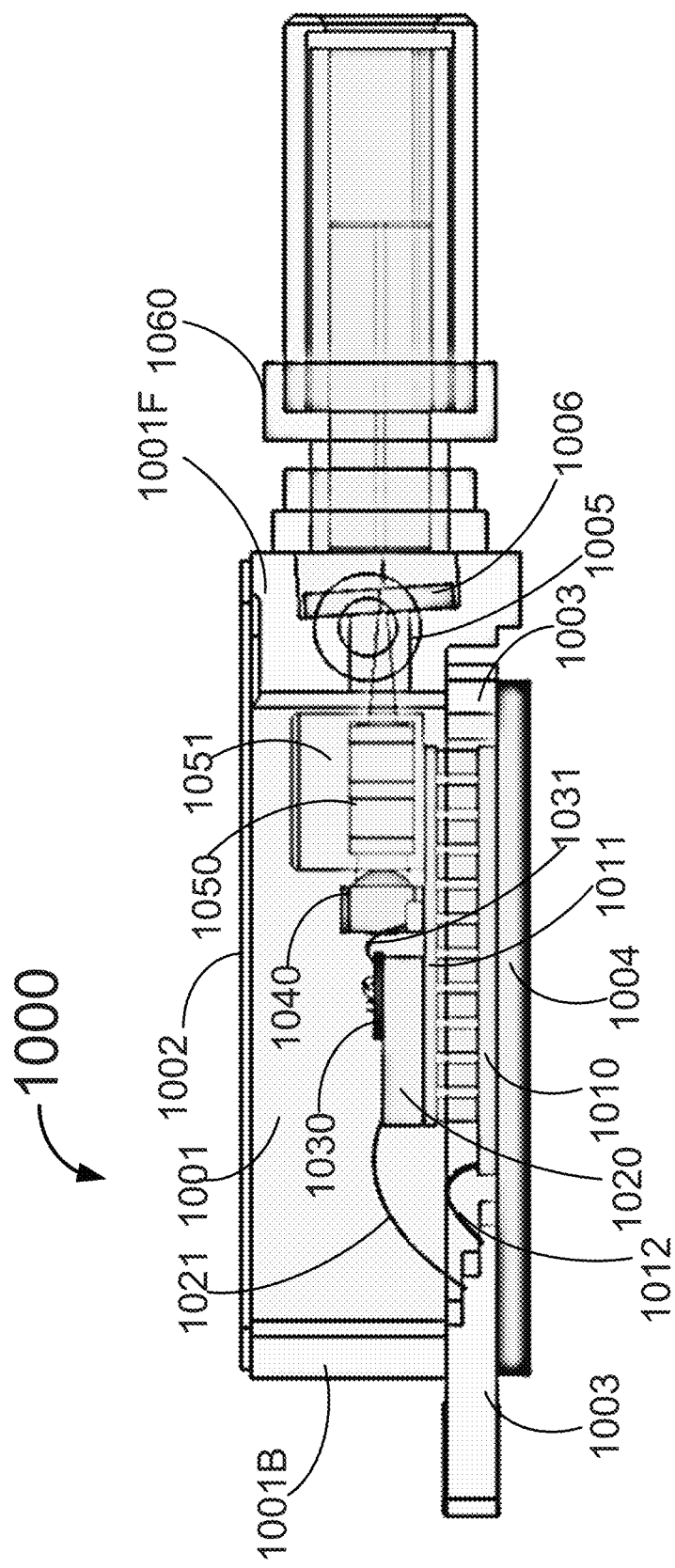
FIG. 13 is a cross-sectional view diagram of a package of the silicon photonics tunable laser device according to an embodiment of the present invention.

In another aspect, the present disclosure provides a compact package for the silicon photonics based tunable laser device. FIG. 13 is a cross-sectional view diagram of a package of the silicon photonics tunable laser device according to an embodiment of the present invention. This diagram is merely an example, which should not unduly limit the scope of the claims. One of ordinary skill in the art would recognize many variations, alternatives, and modifications. As shown, the package structure 1000 of a silicon photonics based tunable laser device is depicted in a cross-sectional view. In an embodiment, the tunable laser device is assembled in a cavity sealed by a metal frame 1001 on sides (with its front end being denoted as 1001F and backend being denoted as 1001B), a lid 1002 on top, and a ceramic ring-shaped plate 1003 combined with a heatsink plate 1004 at bottom. The ceramic ring-shaped plate 1003 is made intentionally hollow in its middle region to allow a thermoelectric cooler sub-assembly 1010 to rest against the heatsink plate 1004 directly. In a specific embodiment, the ceramic ring-shaped plate 1003 is made by high-temperature cofired ceramic (HTCC) material capable of providing high density multi-layer electrical interconnect and feedthroughs. As shown in FIG. 13, the feedthroughs are formed around the backend region of the ceramic plate 1003 which is attached to the backend 1001B of the metal frame 1001. Optionally, these feedthroughs can be used to fill conducting material for connecting the plurality of bond pads and the plurality of conductor pads for electrical input/output connections for the tunable laser device inside the package 1000.

Referring to FIG. 13, a submount 1011 is formed on a hot side of the thermoelectric cooler sub-assembly 1010. On top of the submount 1011, a silicon photonics substrate 1020 can be attached, in which the tunable laser device can be formed and coupled with at least one laser diode chip 1030. Electrical connections between the thermoelectric cooler sub-assembly 1010 with external power supplies are provided via wire bonding 1012. Similarly, some electrical connections between the tunable laser device (such as heaters for controlling tunable filter) may also be connected via wire bonding 1021 with the bond pads on the ceramic ring-shaped plate 1003. The laser diode chip 1030 is flipping bonded with the P-side electrode facing down to bond a bond pad on the silicon photonics substrate 1020. The bond pad is further connected to external driver via wire bonding 1031. Details for flip-bonding of the laser diode chip 1030 have been provided earlier (see FIG. 2).

Referring to FIG. 13, a lens sub-assembly 1040 also is attached on the submount 1010 to align with the laser diode chip 1030 on the silicon photonics substrate 1020. Optionally, the lens sub-assembly is configured to be a single lens with long working distance. The submount 1010 contains stress-relief features for supporting the silicon photonics substrate 1020 with the laser diode chip 1030 being aligned with the lens sub-assembly 1040. Downstream of the optical path, an optical isolator sub-assembly 1050/1051 is also attached on the submount 1010. The isolator 1050 is a compact low profile with a 1.5 stage package and is attached with a specific thermoelectric cooler 1051 for itself for enhancing temperature control to achieve high output stability of a laser beam.

Referring to FIG. 13, the front end 1001F of the metal frame 1001 includes a window region 1005 attached with a window glass 1006 for outputting the laser beam. Outside the front end 1001F, an optical fiber receptacle 1060 is attached.

Figure 14:
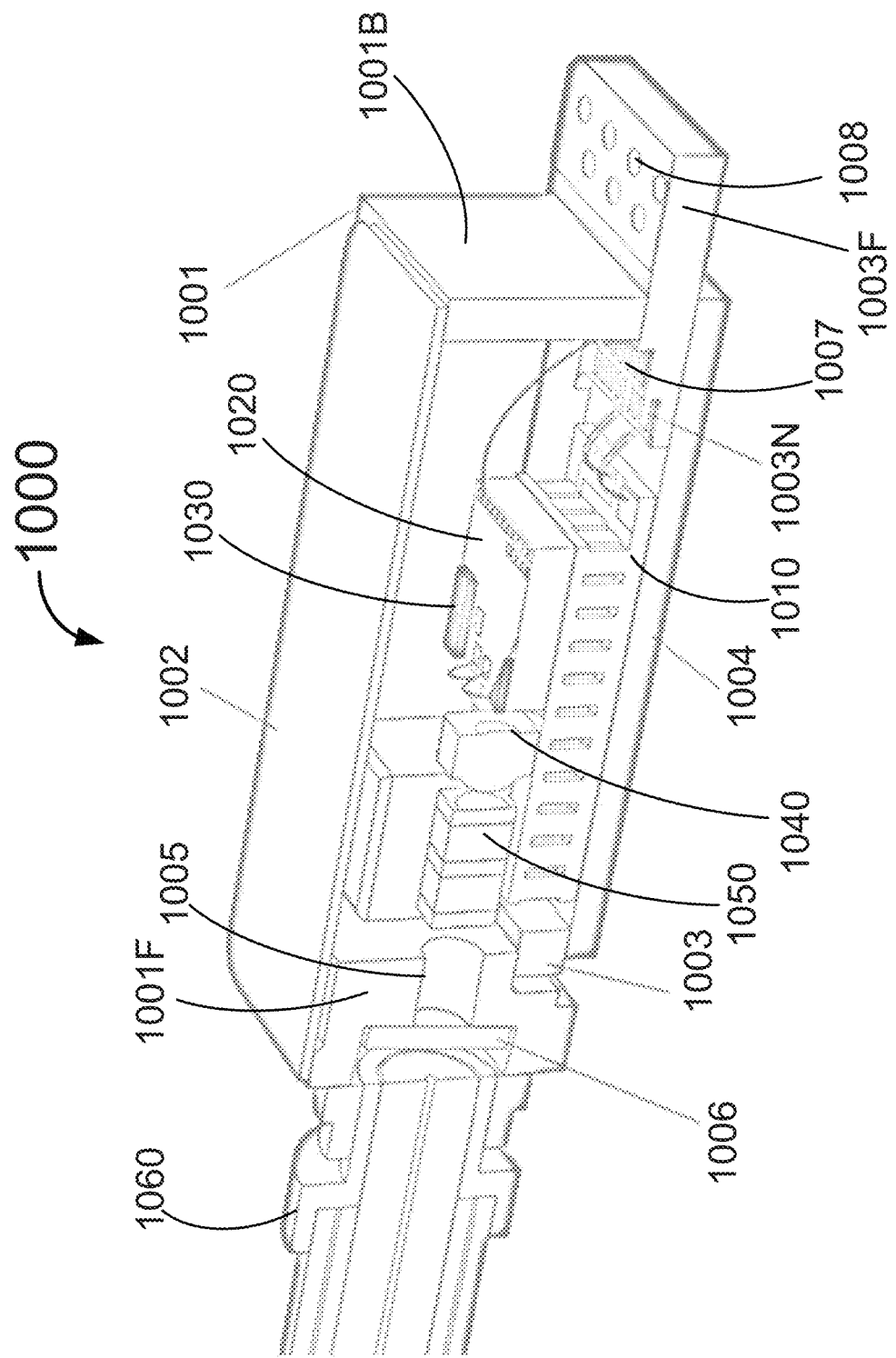
FIG. 14 is a perspective cut view diagram of the package of the silicon photonics tunable laser device according to the embodiment of the present invention.

FIG. 14 is a perspective cut view diagram of the package of the silicon photonics tunable laser device according to the embodiment of the present invention. This diagram is merely an example, which should not unduly limit the scope of the claims. One of ordinary skill in the art would recognize many variations, alternatives, and modifications. As shown, the package 1000 is viewed from a different angle. The ceramic ring-shaped plate 1003 is seen with its end section being divided to a near part 1003N inside the cavity of the package 1000 and a far part 1003F located outside the cavity. On the near part 1003N of the end section, a plurality of bond pads 1007 are formed. On the far part 1003F of the end section, a plurality of conductive pads 1008 are formed and are connected respectively to the plurality of bond pads 1007 through interconnections or feedthroughs formed during the process of forming the HTCC ceramic plate 1003. Other elements of the package 1000 have been shown in FIG. 13.

FIG. 15 is a perspective top view diagram of the package (with a lid being removed) of the silicon photonics tunable laser device according to the embodiment of the present invention. This diagram is merely an example, which should not unduly limit the scope of the claims. One of ordinary skill in the art would recognize many variations, alternatives, and modifications. As shown, the package 1000 is viewed from a perspective top angle with the lid been removed. It can be seen that two laser diode chips 1030 are flipping bonded (with P-side down) to the silicon photonics substrate 1020 for enhancing output power of the laser device. More details on the tunable laser device with silicon photonics tunable filter, two active regions, and a wavelength locker have been disclosed in FIG. 4.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A tunable laser device based on silicon photonics comprising:
   a substrate configured with a first patterned region and a second patterned region, each of the first patterned region and the second patterned region including two vertical stoppers, an edge stopper facing a first direction, and a bond pad between the two vertical stoppers;
   a first integrated coupler built in the substrate next to the edge stopper associated with the first patterned region and a second integrated coupler built in the substrate next to the edge stopper associated with the second patterned region;
   a first laser diode chip flip bonded in the first patterned region with a first gain region aligned with the first integrated coupler;
   a second laser diode chip flip bonded in the second patterned region with a second gain region aligned with the second integrated coupler;
   a silicon photonics tuning filter fabricated in the substrate with two ring resonators coupled via a second waveguide to the second integrated coupler to receive a laser emission from the second laser diode chip, the laser emission being filtered through as a reflected light with a wavelength tuned by the two ring resonators and delivered into a first waveguide coupled to the first integrated coupler to the first laser diode chip; and a wavelength locker fabricated in the substrate and coupled to the silicon photonics tuning filter to lock a wavelength of the reflected light which is amplified and output by the first laser diode chip.

2. The tunable laser device of claim 1 wherein the substrate is a silicon-on-insulator substrate with each of the first patterned region and the second patterned region being formed a step lower than rest surface region and the edge stopper being part of the step along a second direction to be against with an edge of one laser diode chip.

3. The tunable laser device of claim 2 wherein each of the first patterned region and the second patterned region comprises a plurality of first fiducials respectively formed beyond the bond pad yet within the two vertical stoppers along the first direction.

4. The tunable laser device of claim 3 wherein each of the first laser diode chip and the second laser diode chip comprises a plurality of second fiducials configured to respectively engage with the plurality of first fiducials for fixing the first laser diode chip onto the first patterned region with one edge against the edge stopper associated with the first patterned region and respectively fixing the second laser diode chip onto the second patterned region with one edge against the edge stopper associated with the second patterned region.

5. The tunable laser device of claim 4 wherein the first gain region comprises an InP based single-pass cavity between a first end facet with an anti-reflective coating and a second end facet with an anti-reflective coating, including a first metallic electrode formed on top of a P-type active layer of the first laser diode chip.

6. The tunable laser device of claim 5 wherein the first gain region is served as a semiconductor optical amplifier for the reflected light delivered from the silicon photonics tuning filter.

7. The tunable laser device of claim 5 wherein the first metallic electrode is configured to bond with the bond pad in the first patterned region as the first laser diode chip is flipped to rest against the vertical stopper in the first patterned region.

8. The tunable laser device of claim 5 wherein each of the first integrated coupler and the second integrated coupler comprises a Si/SiN based waveguide including a SiN fork shape structure embedded in a Si rectangular waveguide, the SiN fork shape structure including an SiN nanotaper sandwiched in full length laterally by two SiN linear stripes up to an end of the Si/SiN based waveguide that is aligned with the first end facet.

9. The tunable laser device of claim 5 wherein each of the first integrated coupler and the second integrated coupler comprises a Si/SiN based waveguide including a SiN trident shape structure embedded in a Si rectangular waveguide, the SiN trident shape structure including an SiN nanotaper sandwiched in partial length laterally by two SiN symmetrical nanotapers that are extended up to an end of the Si/SiN based waveguide that is aligned with the first end facet.

10. The tunable laser device of claim 4 wherein the second gain region comprises an InP based dual-pass cavity between a third end facet with an anti-reflective coating with an anti-reflective coating and a fourth end facet with a high-reflectivity coating characterized with at least 90% reflectivity over a wide band, the second gain region including a second metallic electrode formed on top of a P-type active layer of the second laser diode chip.

11. The tunable laser device of claim 10 wherein the second gain region is served as a reflective semiconductor optical amplifier for generating the laser emission reflected from the fourth end facet with the high-reflectivity coating and exited through the second integrated coupler.

12. The tunable laser device of claim 10 wherein the second metallic electrode is configured to bond with the bond pad in the second patterned region as the first laser diode chip is flipped to rest against the vertical stopper in the second patterned region.

13. The tunable laser device of claim 1 wherein the silicon photonics tuning filter further comprises a straight phase shifter coupled via a 1-to-2 splitter to the two ring resonators which is coupled via a 2-to-1 combiner to the first waveguide, the straight phase shifter being further coupled directly to the second waveguide.

14. The tunable laser device of claim 13 wherein the two ring resonators comprises slightly different radii to allow the laser emission received from the second gain region being tuned in an extended wavelength range of synthesized spectrum.

15. The tunable laser device of claim 13 wherein each of the first waveguide and the second waveguide is a SiN wire waveguide, the two ring resonators and the straight phase shifter are made from Si wire waveguide.

16. The tunable laser device of claim 13 wherein the silicon photonics tuning filter further comprises at least two first thin-film resistive heaters partially overlying the two ring resonators, and a second thin-film resistive heater partially overlying the straight phase shifter.

17. The tunable laser device of claim 16 wherein the silicon photonics tuning filter is configured to select a wavelength locked by the wavelength locker pre-calibrated for a desired ITU channel wavelength by tuning voltage supplies to the at least two first thin-film resistive heaters and to tune phase at the selected wavelength for matching a round trip cavity lasing condition between a first end facet of the first laser diode chip and a second end facet of the second laser chip by tuning a voltage supply to the second thin-film resistive heater to maximize photocurrent at a monitor port of the wavelength locker.

18. The tunable laser device of claim 17 wherein the ITU channel wavelength locked by the wavelength locker is tuned within a C-band from 1535 nm to 1565 nm.

19. The tunable laser device of claim 17 wherein the ITU channel wavelength locked by the wavelength locker is tuned within an extended C-band from 1520 nm to 1570 nm.

20. The tunable laser device of claim 1 wherein the wavelength locker comprises an input port receiving light reflected from the second laser diode chip and filtered through the silicon photonics tuning filter in an extended wavelength range of a synthesized spectrum, a monitor port split from the input port, a first interference output port and a second interference output port split from two branches of delay-line interferometer waveguides.

21. The tunable laser device of claim 1, wherein the silicon photonics tuning filter is configured to couple the first gain region and the second gain region to form a combined resonate cavity.

* * * * *